United States Patent
Wang et al.

(10) Patent No.: US 11,462,413 B2
(45) Date of Patent: Oct. 4, 2022

(54) PROCESSING OF WORKPIECES USING DEPOSITION PROCESS AND ETCH PROCESS

(71) Applicants: Mattson Technology, Inc., Fremont, CA (US); Beijing E-Town Semiconductor Technology Co., Ltd., Beijing (CN)

(72) Inventors: Shanyu Wang, Fremont, CA (US); Chun Yan, San Jose, CA (US); Hua Chung, Saratoga, CA (US); Michael X. Yang, Palo Alto, CA (US); Tsai Wen Sung, Fremont, CA (US); Qi Zhang, San Jose, CA (US)

(73) Assignees: BEIJING E-TOWN SEMICONDUCTOR TECHNOLOGY CO., LTD., Beijing (CN); MATTSON TECHNOLOGY, INC, Fremont, CA (US)

( * ) Notice: Subject to any disclaimer, the term of this patent is extended or adjusted under 35 U.S.C. 154(b) by 0 days.

(21) Appl. No.: 16/930,392

(22) Filed: Jul. 16, 2020

(65) Prior Publication Data
US 2021/0020445 A1 Jan. 21, 2021

Related U.S. Application Data

(60) Provisional application No. 63/002,488, filed on Mar. 31, 2020, provisional application No. 62/990,752, (Continued)

(51) Int. Cl.
*H01L 21/3065* (2006.01)
*H01L 21/02* (2006.01)
*H01L 21/311* (2006.01)

(52) U.S. Cl.
CPC ...... *H01L 21/3065* (2013.01); *H01L 21/0217* (2013.01); *H01L 21/31116* (2013.01)

(58) Field of Classification Search
None
See application file for complete search history.

(56) References Cited

U.S. PATENT DOCUMENTS 8,252,696 B2 8/2012 Lu et al.
9,093,389 B2 7/2015 Neman et al.
(Continued)

FOREIGN PATENT DOCUMENTS

CN 105719965 A 6/2016

OTHER PUBLICATIONS

International Search Report and Written Opinion for Application No. PCT/US2020/042228, dated Oct. 27, 2020, 12 pages.
(Continued)

*Primary Examiner* — Stephanie P Duclair
(74) *Attorney, Agent, or Firm* — Dority & Manning, P.A.

(57) ABSTRACT

Apparatus, systems, and methods for conducting an etch removal process on a workpiece are provided. The method can include generating a plasma from a deposition process gas in a plasma chamber using a plasma source to deposit a passivation layer on certain layers of a high aspect ratio structure. The method can include generating a plasma from an etch process gas in a plasma chamber using a plasma source to remove certain layers from the high aspect ratio structure. The method can include removing silicon nitride layers at a faster etch rate than silicon dioxide layers on the high aspect ratio structure.

17 Claims, 17 Drawing Sheets

Related U.S. Application Data filed on Mar. 17, 2020, provisional application No. 62/875,104, filed on Jul. 17, 2019.

(56) References Cited

U.S. PATENT DOCUMENTS

| | | |
|---|---|---|
| 9,343,327 B2 | 5/2016 | Zhang et al. |
| 9,384,997 B2 | 7/2016 | Ren et al. |
| 10,319,603 B2 | 6/2019 | Chen et al. |
| 2006/0205216 A1 | 9/2006 | Sato |
| 2007/0051471 A1* | 3/2007 | Kawaguchi ........... H01J 37/321 |
| | | 156/345.36 |
| 2013/0078776 A1 | 3/2013 | Kim et al. |
| 2015/0214067 A1 | 7/2015 | Zhang et al. |
| 2016/0181116 A1 | 6/2016 | Berry, III et al. |
| 2016/0247688 A1 | 8/2016 | Zhu et al. |
| 2018/0102255 A1 | 4/2018 | Chen et al. |
| 2019/0043732 A1* | 2/2019 | Eason ............... H01L 27/11556 |
| 2019/0122866 A1 | 4/2019 | Nam et al. |

OTHER PUBLICATIONS

Shinoda et al., "Selective atomic-level etching using two heating procedures, infrared irradiation and ion bombardment, for next-generation semiconductor device manufacturing," *J. Phys. D: Appl. Phys. 50*, Apr. 2017, pp. 1-13.

\* cited by examiner

PROCESSING OF WORKPIECES USING DEPOSITION PROCESS AND ETCH PROCESS

PRIORITY CLAIM

The present application claims the benefit of priority of U.S. Provisional Application Ser. No. 62/875,104, titled "Processing Of Workpieces Using Deposition Process and Etch Process," filed Jul. 17, 2019, which is incorporated herein by reference for all purposes. The present application claims the benefit of priority of U.S. Provisional Application Ser. No. 62/990,752, titled "Selective SiN Lateral Recess With Byproduct-Enabled Vertical Loading Control," filed Mar. 17, 2020, which is incorporated herein by reference for all purposes. The present application claims the benefit of priority of U.S. Provisional Application Ser. No. 63/002,488, titled "Selective SiN Lateral Recess With Byproduct-Enabled Vertical Loading Control," filed Mar. 31, 2020, which is incorporated herein by reference for all purposes.

FIELD

The present disclosure relates generally to apparatus, systems, and methods for processing a workpiece using a plasma source.

BACKGROUND

Plasma processing is widely used in the semiconductor industry for deposition, etching, resist removal, and related processing of semiconductor wafers and other substrates. Plasma sources (e.g., microwave, ECR, inductive coupling, etc.) are often used for plasma processing to produce high density plasma and reactive species for processing substrates. Post-implantation photoresist, post-etch residue, and other mask and/or material removal have been accomplished using plasma dry strip processes. In plasma dry strip processes, neutral species (e.g., radicals) from a plasma generated in a remote plasma chamber pass through a separation grid into a processing chamber to treat a workpiece, such as a semiconductor wafer. In plasma etch processes, radicals, ions, and other species generated in a plasma directly exposed to the workpiece can be used to etch and/or remove a material on a workpiece.

Plasma processing tools can include a plasma chamber where plasma is generated and a separate processing chamber where the substrate is processed. The processing chamber can be "downstream" of the plasma chamber such that there is no direct exposure of the substrate to the plasma. A separation grid can be used to separate the processing chamber from the plasma chamber. The separation grid can be transparent to neutral species but not transparent to charged species from the plasma. The separation grid can include one or more sheets or plates of material with holes.

SUMMARY

Aspects and advantages of embodiments of the present disclosure will be set forth in part in the following description, or may be learned from the description, or may be learned through practice of the embodiments.

One example aspect of the present disclosure is directed to method for processing a workpiece. The workpiece can include a high aspect ratio structure. The high aspect ratio structure can include a plurality of silicon nitride layers and a plurality of silicon dioxide layers arranged in an alternating fashion. The method can include placing a workpiece on a workpiece support in a processing chamber. The method can include performing a deposition process to deposit a passivation layer on a surface of at least one of the plurality of silicon dioxide layers. The deposition process includes exposing the workpiece to radicals generated from a deposition process gas in a deposition plasma. The method includes performing an etch process to remove at least a portion of the plurality of silicon nitride layers laterally at an etch rate that is greater than an etch rate of the plurality of silicon dioxide layers.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
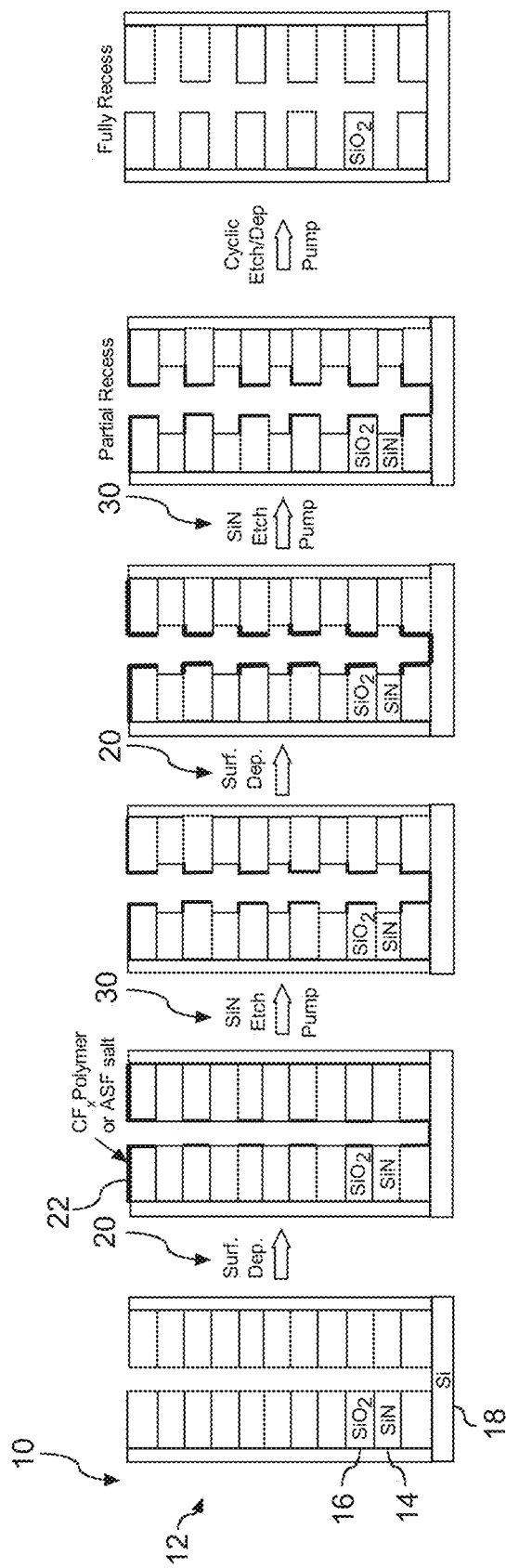
FIG. 1 depicts an example deposition process and etch removal process on a high aspect ratio structure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to processes for treating a workpiece having a high aspect ratio structure that includes alternating layers of silicon dioxide and silicon nitride (e.g., ONON structure). Plasma dry etch processes play a considerable role in fabricating high-performance semiconducting devices, especially with continuous scaling of the dimensions of the workpiece down to below 10 nm. Silicon nitride dry etch processes can be used in a variety of applications in complementary metal-oxide-semiconductor logic and 3D NAND memory devices, such as gate etching masks, diffusion barrier layers, various spacers, stress generators, sacrificial layers, stopper layers, and other hard masks.

Selective silicon nitride etch over silicon dioxide etch or silicon etch can be desired for building 3D NAND memory devices. Indeed, partial or complete silicon nitride removal with minimal or reduced damage to the other oxide layers or silicon substrate is desired, which can require a high silicon nitride to silicon dioxide and silicon nitride to silicon selectivity.

Silicon nitride can be removed via a wet process utilizing, for instance, hot phosphoric acid containing various additives. The wet process can achieve high silicon nitride to silicon dioxide and silicon selectivity; however, it suffers from various issues including a low (slow) etch rate, serious residue and particle contamination of the workpiece, large amounts of waste, high cost of operation, and poor vertical loading in the structures having high aspect ratios.

Switching from the wet process to a dry etch process may solve many of the aforementioned issues; however certain dry etch processes utilizing fluorine-based plasma have a severely limited selectivity for silicon nitride over silicon dioxide or silicon. Also, silicon nitride etch in fluorocarbon plasma or other pure fluorine plasmas is relatively slow. Additionally, achieving a good etch vertical loading in advanced 3D multilayer ONON structures with a high aspect ratio (>50:1) is extremely challenging due to requirements of high throughput and the intrinsically slow mass transportation in high aspect ratio channel holes or slits, including etchant diffusion down and byproduct pump out. Poor vertical loading, (e.g., more recess on top and less recess on the bottom, can cause device failure and other related issues. Further, highly selective silicon nitride to silicon dioxide etch can be challenging to achieve due to the similar bonding nature of silicon nitride and silicon dioxide bonds, (e.g., bonding energy, bonding length, etc.). Highly selective silicon nitride to silicon etch can be even more difficult since the Si—Si bond is much weaker than the Si—N bond (e.g., 222 kJ/mol for Si—Si compared to 355 kJ/mol for Si—N).

According to example embodiments of the present disclosure, a process can expose a workpiece having a high aspect ratio structure including a plurality of alternating layers of silicon nitride and silicon dioxide to radicals generated from a deposition process gas in a deposition plasma in order to deposit the silicon dioxide layers with a passivation layer. The workpiece can then be exposed to radicals generated from a etch process gas in order to remove the silicon nitride layers at an etch rate that is greater than the etch rate of the silicon dioxide layers. The deposition process and etch process can be cyclically alternated until the plurality of silicon nitride layers have been removed, leaving the silicon dioxide layers remaining on the silicon substrate.

Aspects of the present disclosure can provide a number of technical effects and benefits. For instance, using a cyclic deposition/etch process according to example embodiments of the present disclosure can achieve a high silicon nitride etch rate, such as, in some examples, up to 150 nm per minute. In addition, high silicon nitride to oxide and silicon nitride to silicon selectivity can be achieved. In addition, excellent vertical loading of the recess can be expected by using the alternating deposition and etch processes according to example aspects of the present disclosure.

Aspects of the present disclosure are discussed with reference to a "workpiece," "substrate," "wafer" (e.g., semiconductor wafer) for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within twenty percent (20%) of the stated numerical value. A "pedestal" refers to any structure that can be used to support a workpiece.

FIG. 1 depicts an overview of an example deposition process 20 and etch process 30 for a workpiece 10 having a high aspect ratio structure 12 according to example embodiments of the present disclosure. The high aspect ratio structure 12 includes a plurality of silicon nitride layers 14 and a plurality of silicon dioxide layers 16 disposed on a substrate 18, such as a silicon substrate. The high aspect ratio structure 12 can include a plurality of silicon nitride layers and a plurality of silicon dioxide layers arranged in an alternating fashion. For example, as shown in FIG. 1, the high aspect ratio structure 12 may contain a layer of silicon nitride having a layer of silicon dioxide on top of the silicon nitride layer in a vertical fashion. This vertical alternating arrangement between the silicon nitride layers 14 and silicon dioxide layers 16 may be repeated.

A deposition process 20 can be conducted on the high aspect ratio structure 12 to deposit a passivation layer 22 on the plurality of silicon dioxide layers 16. The deposition process 20 may also deposit passivation layer 22 on substrate 18. An etch process 30 can then be conducted on the high aspect ratio structure 12 to remove at least a portion of the silicon nitride 14 layers. In certain aspects, the plurality of silicon nitride layers 14 are removed laterally. With reference to FIG. 1, laterally is shown as removal in the horizontal plane of the figure. Passivation of the silicon dioxide layers 14 and the substrate 18 leads to improved selectivity of the etch process 30 for the silicon nitride layers 14. The deposition process 20 and the etch process 30 can then be cyclically repeated until the resultant workpiece 10 contains a designated amount silicon nitride recess or substantially no silicon nitride layers 14 having only the silicon dioxide layers 16 remaining on the substrate 18 of the workpiece 10.

Figure 2:
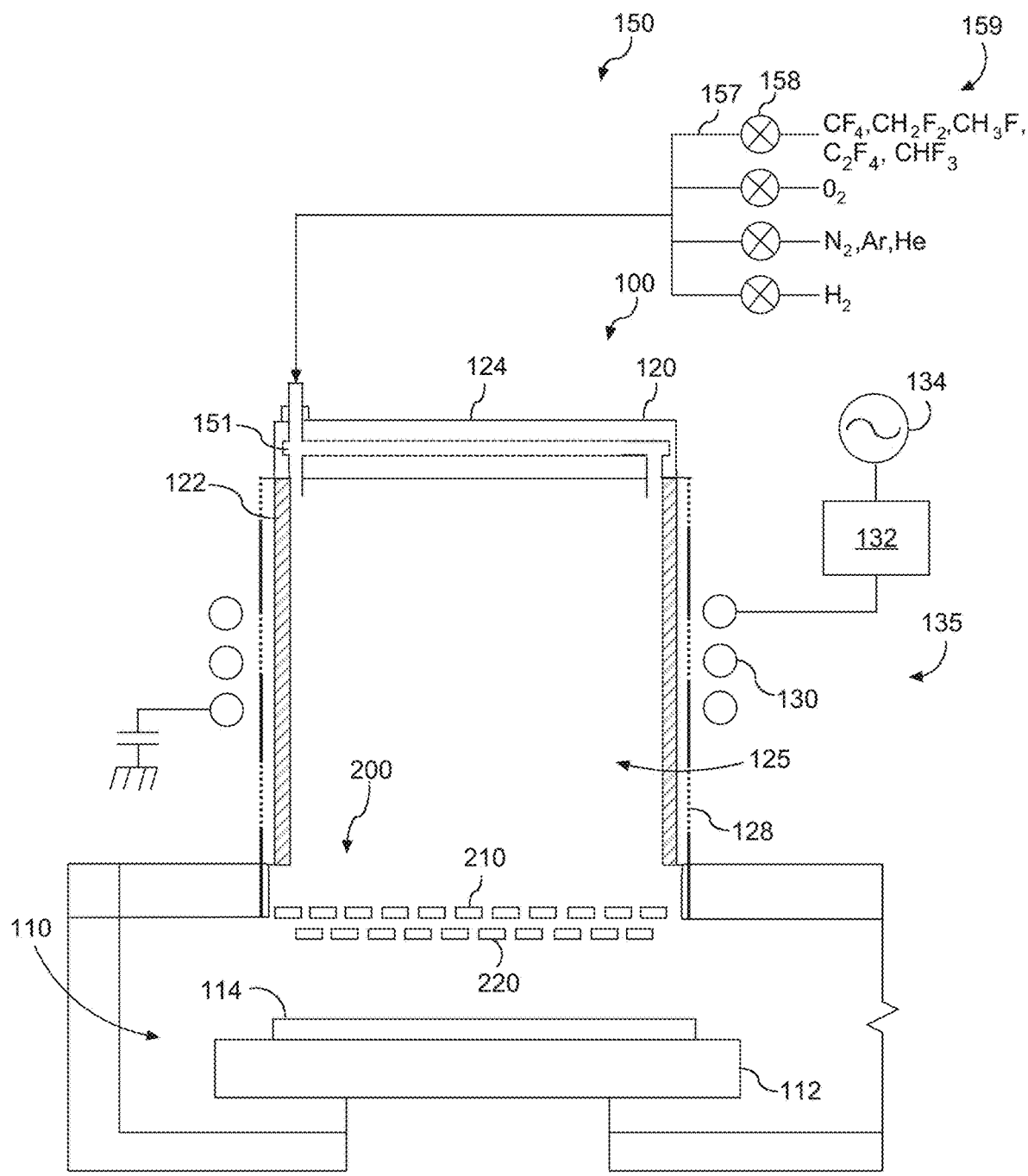
FIG. 2 depicts an example plasma processing apparatus according to example embodiments of the present disclosure.

FIG. 2 depicts an example plasma processing apparatus 100 that can be used to perform the deposition process(s) and etch process(s) according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., as described in detail below) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 2, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged species can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral species.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with a single grid plate. In some embodiments, the grid assembly can include at least three grid plates.

As shown in FIG. 2, the apparatus 100 can include a gas delivery system 150 configured to deliver process gas to the plasma chamber 120, for instance, via gas distribution channel 151 or other distribution system (e.g., showerhead). The gas delivery system 150 can include a plurality of feed gas lines 159. The feed gas lines 159 can be controlled using valves and/or mass flow controllers to deliver a desired amount of gases into the plasma chamber as process gas. As shown in FIG. 2, the gas delivery system 150 can include feed gas line(s) for delivery of a fluorine containing gas (e.g., $CF_4$, $C_2F_4$, $CHF_3$, $CH_2F_2$, $CH_3F$). The gas delivery system 150 can include feed gas line(s) for delivery of an oxygen containing gas (e.g., $O_2$, NO, $CO_2$). The gas delivery system 150 can include feed gas line(s) for delivery of a dilution gas (e.g., $N_2$, Ar, He, or other inert gas). The gas delivery system 150 can include feed gas line(s) for delivery of a hydrogen containing gas (e.g., $H_2$, $CH_4$, $NH_3$).

Figure 3:
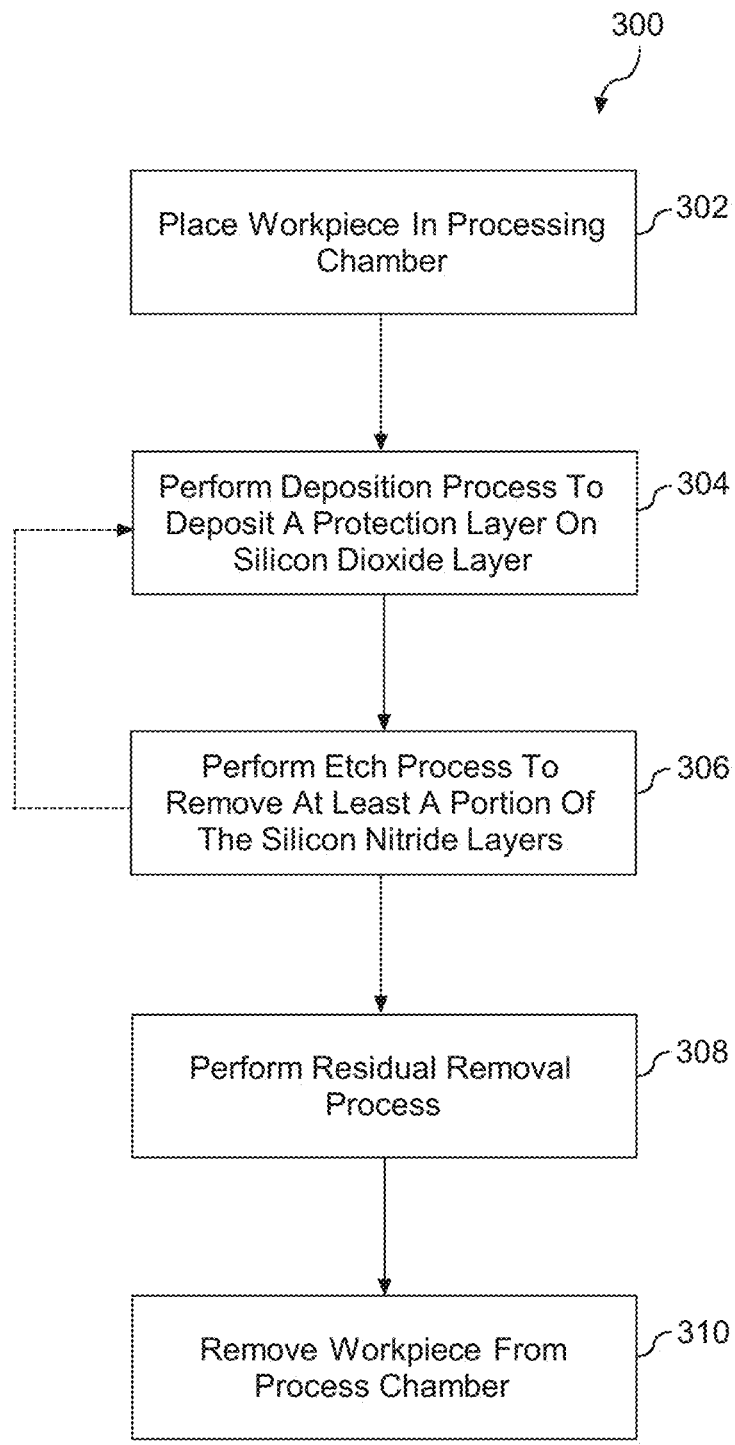
FIG. 3 depicts a flow diagram of an example method according to example embodiments of the present disclosure.

FIG. 3 depicts a flow diagram of one example method (300) according to example aspects of the present disclosure. The method (300) will be discussed with reference to the plasma processing apparatus 100 of FIG. 2 by way of example. The method (300) can be implemented in any suitable plasma processing apparatus. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (302) the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 2.

At (304) the method can include conducting a deposition process to deposit a passivation layer on a workpiece. The deposition process can be carried out in a separate processing apparatus relative to the remainder of the method (300) or can be conducted using the same processing apparatus. In certain embodiments, the deposition process can include generating one or more species from a deposition process gas using a plasma induced in a plasma chamber, filtering the one or more species to generate a filtered deposition mixture, and exposing the plurality of silicon dioxide layers to the filtered deposition mixture. In embodiments, the deposition process can include generating a plasma (such as a deposition plasma) from a deposition process gas in the plasma chamber 120, filtering ions with the separation grid assembly 200, and allowing neutral radicals to pass through the separation grid assembly 200. The neutral radicals can be exposed to the workpiece 114 to selectively coat the layers of silicon dioxide and silicon substrate with a passivation layer 22.

The process gas used during the deposition process (304) can include a fluorine containing gas. For instance, the process gas can include tetrafluoromethane ($CF_4$), difluoromethane ($CH_2F_2$), fluoromethane ($CH_3F$), fluoroform ($CHF_3$), tetrafluoroethylene ($C_2F_4$), and combinations thereof. Other fluorine containing gases can be used without deviating from the scope of the present disclosure.

Other suitable gases can be included in the process gas. For instance, the process gas can include an oxygen containing gas, e.g. oxygen ($O_2$), nitric oxide (NO), or carbon dioxide ($CO_2$) gas. The process gas can include a hydrogen containing gas, e.g. hydrogen ($H_2$), methane ($CH_4$), or ammonia ($NH_2$). The process gas can include a dilution gas, such as nitrogen ($N_2$) and/or an inert gas, such as helium (He), argon (Ar) or other inert gas.

The deposition process can include generating one or more species from a deposition process gas using a plasma induced in a plasma chamber and filtering the one or more species via a separation grid separating the plasma chamber from the processing chamber in order to generate a filtered deposition mixture.

At (306), the method can include performing an etch process, such as a plasma etch process. The etch process can be carried out in a separate processing apparatus relative to the remainder of the method (300) or can be conducted using the same processing apparatus. The etch process can include generating a plasma (such as an etching plasma) from an etch process gas in the plasma chamber 120, filtering ions with the separation grid assembly 200, and allowing neutral radicals to pass through the separation grid assembly 200. The neutral radicals can be exposed to the workpiece 114 to at least partially remove at least a portion of the silicon nitride layers from the workpiece 114.

In embodiments, the etch process can include generating one or more species from an etch process gas using a plasma induced in a plasma chamber, filtering the one or more species to generate a filtered etching mixture, and exposing the plurality of silicon nitride layers to the filtered etching mixture to remove at least a portion of the plurality of silicon nitride layers laterally at an etch rate that is greater than an etch rate of the plurality of silicon dioxide layers. In embodiments, the one or more species can be filtered via a separation grid separating the plasma chamber from the processing chamber to form the filtered etching mixture.

The process gas used during the etch process (304) can include a fluorine containing gas. For instance, the process gas can include tetrafluoromethane ($CF_4$), difluoromethane ($CH_2F_2$), fluoromethane ($CH_3F$), fluoroform ($CHF_3$), tetrafluoroethylene ($C_2F_4$), and combinations thereof. Other fluorine containing gases can be used without deviating from the scope of the present disclosure.

Other suitable gases can be included in the process gas. For instance, the process gas can include an oxygen containing gas, e.g. oxygen ($O_2$), nitric oxide (NO), or carbon dioxide ($CO_2$) gas. The process gas can include a hydrogen containing gas, e.g. hydrogen ($H_2$), methane ($CH_4$), or ammonia ($NH_3$). The process gas can include a dilution gas, such as nitrogen ($N_2$) and/or an inert gas, such as helium (He), argon (Ar) or other inert gas.

Further, as shown in FIG. 3, the method can further include alternating the deposition process (304) and the etch process (306) until desired amount or substantially all the silicon nitride layers have been removed from the workpiece 114.

At (308), the method can include performing a residual removal process to remove any residual passivation layer 22 that may remain on workpiece 114. The residual removal process can be carried out in a separate processing apparatus relative to the remainder of the method (300) or can be conducted using the same processing apparatus. The residual removal process can include generating a plasma from a second etch process gas in the plasma chamber 120, filtering ions with the separation grid assembly 200, and allowing neutral radicals to pass through the separation grid assembly 200. The neutral radicals can be exposed to workpiece 114 to at least partially or completely remove passivation layer remaining on workpiece 114. In embodiments, the residual removal process includes generating one or more species from a second etch process gas using a plasma induced in a plasma chamber, filtering the one or more species to generate a filtered second etching mixture, and exposing the plurality of silicon nitride layers and silicon dioxide layers to the filtered second etching mixture in the processing chamber, wherein the second etching mixture removes any remaining passivation layer from the workpiece.

The process gas used during the residual removal process at (308) can include a fluorine containing gas. For instance, the process gas can include tetrafluoromethane ($CF_4$), difluoromethane ($CH_2F_2$), fluoromethane ($CH_3F$), fluoroform ($CHF_3$), tetrafluoroethylene ($C_2F_4$), and combinations thereof. Other fluorine containing gases can be used without deviating from the scope of the present disclosure.

Other suitable gases can be included in the process gas. For instance, the process gas can include an oxygen containing gas, e.g. oxygen ($O_2$), nitric oxide (NO), or carbon dioxide ($CO_2$) gas. The process gas can include a hydrogen containing gas, e.g. hydrogen ($H_2$), methane ($CH_4$), or ammonia ($NH_3$). The process gas can include a dilution gas, such as nitrogen ($N_2$) and/or an inert gas, such as helium (He), argon (Ar) or other inert gas.

At (310) of FIG. 3, the method can include removing the workpiece from the processing chamber. For instance, the workpiece 114 can be removed from workpiece support 112 in the processing chamber 110. The plasma processing apparatus can then be conditioned for future processing of additional workpieces.

Figure 4:
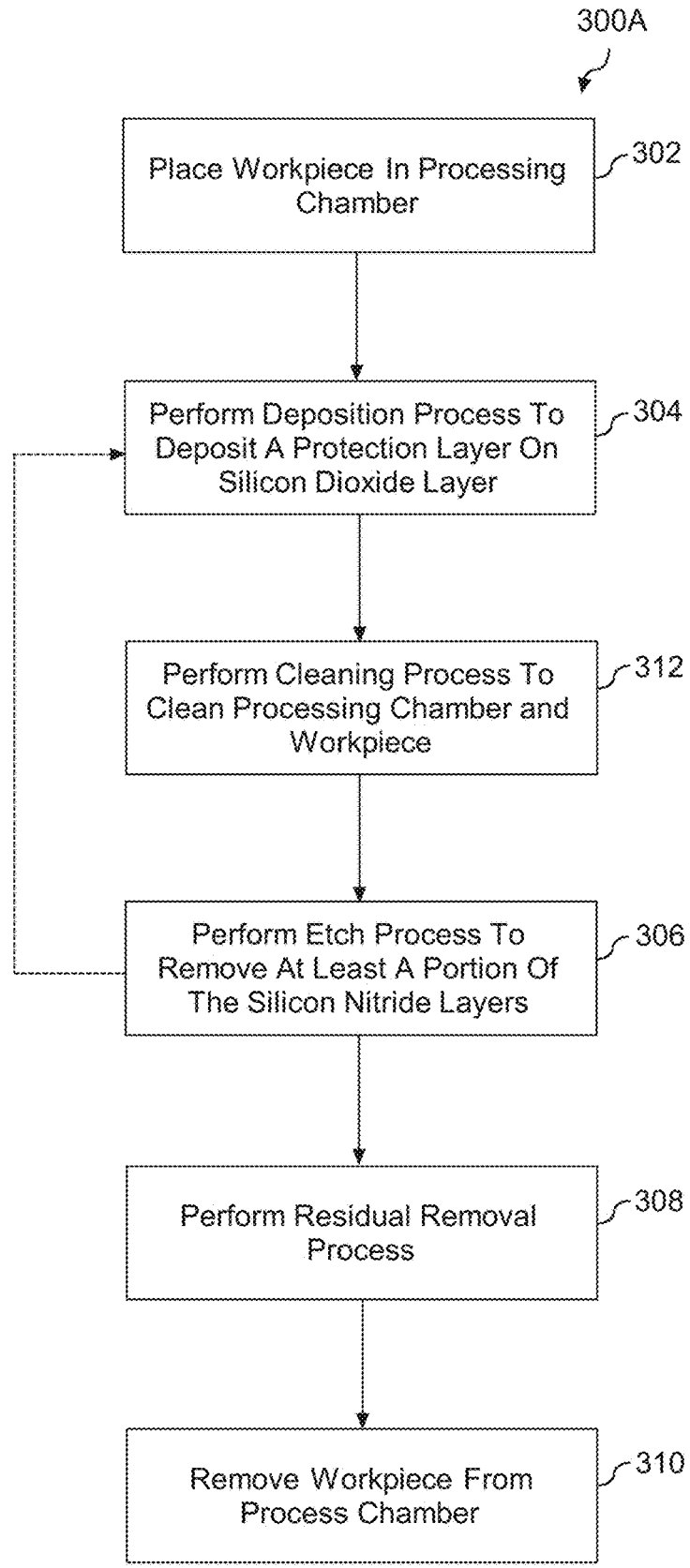
FIG. 4 depicts a flow diagram of an example method according to example embodiments of the present disclosure.

FIG. 4 depicts a flow diagram of one example method (300A) according to example aspects of the present disclosure. The method (300A) will be discussed with reference to the plasma processing apparatus 100 of FIG. 2 by way of example. The method (300A) includes the same steps as provided in method (300) discussed in FIG. 2, However, at (312) the method may include performing a cleaning process to expose the processing chamber 110 and workpiece 114 contained therein to a purging gas. In embodiments, the cleaning process can be performed after the deposition process and before the etch process.

The purging gas used during the cleaning process can include an $O_2$ gas. The purging gas can include an $H_2$ gas. The purging gas may be introduced to the processing chamber through the gas delivery system 150. The gas delivery system 150 can include feed gas line(s) for delivery of an oxygen containing gas (e.g., oxygen ($O_2$), nitric oxide (NO), carbon dioxide ($CO_2$)). The gas delivery system 150 can include feed gas line(s) for delivery of a hydrogen containing gas (e.g., hydrogen ($H_2$), methane ($CH_4$), ammonia ($NH_3$)). The purging gas may be introduced into the plasma chamber 120 and flow through the separation grid 200 into the processing chamber 110. The purging gas may be introduced directly into the processing chamber via a gas delivery system configured to deliver purging gas directly into the plasma chamber 120 (not shown) and/or at the separation grid, for instance, via gas distribution channels or other distribution systems. The purging gas may also be introduced to the processing chamber 110 via a gas injection port configured to inject gas directly in the processing chamber 110.

Figure 5:
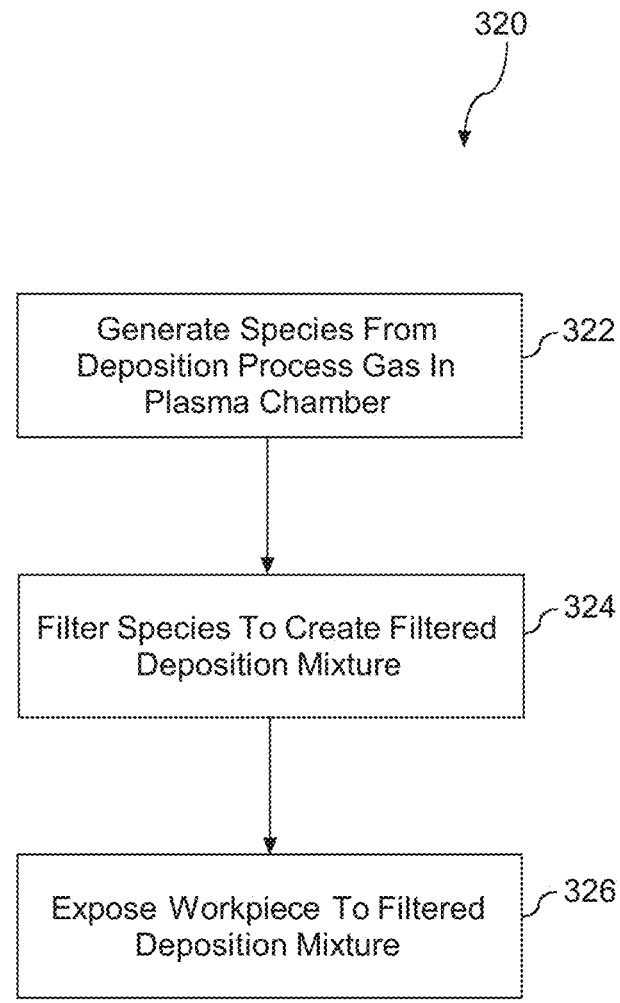
FIG. 5 depicts a flow diagram of an example surface treatment process according to example embodiments of the present disclosure.

FIG. 5 depicts a flow diagram of one example method of the deposition process (320) according to the present disclosure. The method (320) will be discussed with reference to the plasma processing apparatus 100 of FIG. 2 by way of example.

At (322) deposition process can include generating a plasma from a deposition process gas in the plasma chamber 120 of the plasma processing apparatus. The deposition process gas may be introduced to the plasma chamber through the gas delivery system 150. The deposition process gas may include any suitable process gas including, but not limited to: tetrafluoromethane ($CF_4$), methane ($CH_4$), tetrafluoroethylene ($CF_4$), fluoroform ($CHF_3$), difluoromethane ($CH_2F_2$), fluoromethane ($CH_3F$), oxygen ($O_2$), nitrogen ($N_2$) and/or hydrogen ($H_2$) gas. The deposition process gas can include a dilution gas, such as nitrogen ($N_2$) and/or an inert gas, such as helium (He), argon (Ar) or other inert gas.

At (324) the deposition process can include filtering the species generated from (322) to generate a filtered deposition mixture. The separation grid 200 can be used to perform ion filtering on the plasma generated in the plasma chamber 120 from the deposition process gas to generate a filtered deposition mixture. Briefly, charged species generated from the deposition process gas in the plasma chamber 120 can recombine on the walls in their path through the holes of each grid plate 210, 200 in the separation grid 200. Neutral species (e.g., radicals) can flow relatively freely through the holes of each grid plate 210, 200. Accordingly, the separation grid 200 filters the plasma generated from the deposition gas in the plasma chamber 120, allowing a filtered deposition mixture to enter the processing chamber 110.

In some aspects, the deposition process (320) may further include admitting a non-process gas through one or more gas injection ports at or below the separation grid 200 to adjust the radical distribution or the energy of the radicals passing through the separation grid 200. (Not Shown). The non-process gas may include a dilution gas, such as nitrogen ($N_2$) and/or an inert gas, such as helium (He), argon (Ar) or other inert gas. The non-process gas may be injected prior to exposing the workpiece to the filtered deposition mixture.

At (326) the deposition process can include exposing the workpiece to the filtered deposition mixture to deposit a passivation layer on the workpiece. More specifically, the filtered deposition mixture may deposit a passivation layer on the silicon dioxide layers and silicon substrate of the workpiece. The passivation layer can improve the selectivity of the etch process for the silicon nitride layers relative to the silicon dioxide layers and the silicon substrate. The passivation layer may be composed of a fluorocarbon polymer (e.g. Teflon-like $(CF_2)_x$), a hydrofluorocarbon polymer (e.g. $(CH_aF_{2-a})_x$), a slat ammonium silicon fluoride salt (e.g. ammonium fluorosilicate $(NH_4)_2SiF_6$), or combinations thereof. In certain aspects, deposition of the passivation layer of polymer or a slat ammonium silicon fluoride salt may provide surface passivation against fluoride attack in the following etch process. The deposition of polymer or a slat ammonium silicon fluoride salt on a metal oxide layer, e.g. silicon dioxide, or a silicon layer, e.g. the silicon substrate, may be enabled by the electrostatic affinity of oxygen to cations, for example carbon in the fluorocarbon polymer and silicon or $NH_4$ in the slat ammonium silicon fluoride salt. Silicon nitride, however, has a very thin oxynitride and thus exhibits the least passivation. The effects of surface passivation may be adjusted by adjusting the plasma conditions, substrate temperature, surface treatment time, etc.

Figure 6:
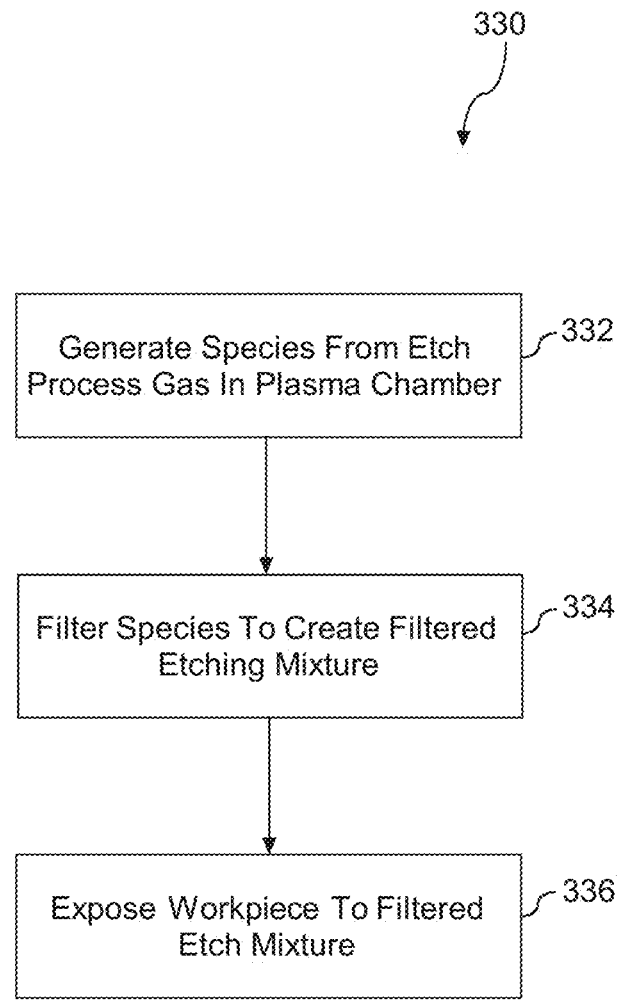
FIG. 6 depicts flow diagram of an example surface treatment process according to example embodiments of the present disclosure.

FIG. 6 depicts a flow diagram of one example method of the etch process (330) according to the present disclosure. The method (330) will be discussed with reference to the plasma processing apparatus 100 of FIG. 2 by way of example.

At (332) etch process can include generating a plasma from an etch process gas in the plasma chamber 120 of the plasma processing apparatus 100. The etch process gas may be introduced to the plasma chamber through the gas delivery system 150, The etch process gas may include any suitable process gas including, but not limited to: tetrafluoromethane ($CF_4$), tetrafluoroethylene ($C_2F_4$), fluoroform ($CHF_3$), difluoromethane ($CH_2F_2$), fluoromethane ($CH_3F$), oxygen ($O_2$), carbon dioxide ($CO_2$), nitric oxide (NO), nitrogen ($N_2$), methane ($CH_4$), and/or hydrogen ($H_2$) gas. The etch process gas can include a dilution gas, such as nitrogen ($N_2$) and/or an inert gas, such as helium (He), argon (Ar) or other inert gas.

At (334) the etch process can include filtering the species generated from (332) to generate a filtered etching mixture. The separation grid 200 can be used to perform ion filtering on the plasma generated in the plasma chamber 120 from the etch process gas to generate a filtered etching mixture. Briefly, charged species generated from the etch process gas in the plasma chamber 120 can recombine on the walls in their path through the holes of each grid plate 210, 200 in the separation grid 200. Neutral species (e.g., radicals) can flow relatively freely through the holes of each grid plate 210, 200. Accordingly, the separation grid 200 filters the plasma generated from the etch gas in the plasma chamber 120, allowing a filtered etching mixture to enter the processing chamber 110.

At (336) the etch process can include exposing the workpiece to the filtered etching mixture to remove at least a portion of the plurality of silicon nitride layers laterally at an etch rate that is greater than an etch rate of the silicon dioxide layers. The etch rate of the silicon dioxide layers may be zero. In some embodiments, the filtered etching mixture removes at least a portion of the plurality of silicon nitride layers laterally at an etch rate that is greater than an etch rate of the silicon substrate. The etch rate of the silicon substrate may be zero. In certain embodiments, the ratio of etch rate of the plurality of silicon nitride layers to the etch rate of the plurality of silicon dioxide layers is greater than about 500. In some embodiments, exposure of the workpiece to the filtered etching mixture may remove at least a portion of the passivation layer that has been deposited on the silicon dioxide layers without removing any of the silicon dioxide layers themselves. In some embodiments, exposure of the workpiece to the filtered etching mixture may remove at least a portion of the passivation layer that has been deposited on the silicon substrate without removing any of the silicon substrate.

In some aspects, the etch process (330) may further include admitting a non-process gas through one or more gas injection ports at or below the separation grid 200 to adjust radical distribution or the energy of the radicals passing through the separation grid 200. (Not Shown). The non-process gas may include a dilution gas, such as nitrogen ($N_2$) and/or an inert gas, such as helium (He), argon (Ar) or other inert gas. The non-process gas may be injected prior to exposing the workpiece to the filtered etching mixture.

Figure 7:
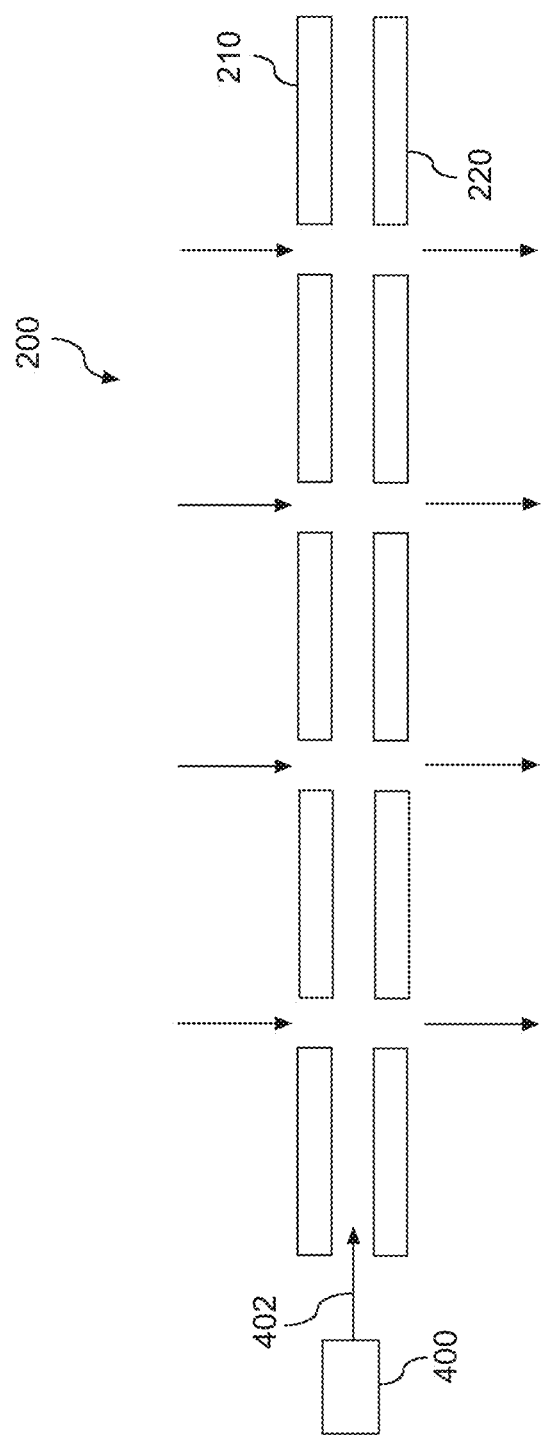
FIG. 7 depicts example gas injection after ion filtering during a surface treatment process according to example embodiments of the present disclosure.

FIG. 7 illustrates an example post plasma gas injection at a separation grid according to example embodiments of the disclosure. FIG. 7 will be discussed with reference to the plasma processing apparatus 100 of FIG. 2 by way of example.

According to example aspects of the present disclosure, the plasma processing apparatus 100 can include one or more gas ports 400 configured to inject a gas into the neutral species flowing through the separation grid 200. For instance, a gas port 400 can be operable to inject a gas (e.g., a cooling gas) between grid plates in a multi-plate separation grid. In this way, the separation grid can provide post plasma gas injection into the neutral species. The post plasma gas injection can provide a number of technical effects and benefits. For example, the gas can be injected, for example, to control uniformity characteristics of a process. For example, a neutral gas (e.g., inert gas) can be injected to control uniformity, such as uniformity in a radial direction with respect to the workpiece. Cooling gas can be injected to control the energy of radicals passing through the separation grid.

The separation grid 200 can be a multi-plate separation grid (e.g., a dual-plate grid (shown in FIG. 2, a three-plate grid, a four-plate grid, etc.). As shown in FIG. 7, the plasma processing apparatus 100 can include a gas port 400 configured to inject a gas 402 between grid plate 210 and grid plate 220, such as in the channel formed between grid plate 210 and grid plate 220. More particularly, the mixture of ions and neutral species generated in the plasma can be exposed to grid plate 210. The gas port 400 can inject a gas 402 or other substance into neutral species flowing through the grid plate 210. Neutral species passing through grid plate 220 can be exposed to a workpiece. In some embodiments, the gas port 400 can inject a gas 402 directly into the processing chamber 110 at a location below the separation grid and above the surface of the workpiece 114.

The gas 402 or other substance from the gas port 400 can be at a higher or lower temperature than the radicals coming from the plasma chamber 120 or can be the same temperature as the radicals from the plasma chamber 120. The gas can be used to adjust or correct uniformity, such as radial uniformity, within the plasma processing apparatus 100, by controlling the energy of the radicals passing through the separation grid 200. The non-process gas may include a dilution gas, such as nitrogen ($N_2$) and/or an inert gas, such as helium (He), argon (Ar) or other inert gas. In some embodiments, the gas 402 can be an inert gas, such as helium, nitrogen, and/or argon.

In some aspects, the deposition process (320), the etch process (330), or the residual removal process, may further include the step of admitting a non-process gas through one or more gas ports 400 at or below the separation grid 200 to adjust the energy of the radicals passing through the separation grid 200.

Example process parameters for the deposition process will now be set forth.

Example 1

Process Gas: $CF_4$, $CH_4$, $CH_2$, $N_2$
Dilution Gas: He or Ar
Process Pressure: about 100-800 mTorr
Inductively Coupled Plasma Source Power: about 1000-2500 W
Workpiece Temperature: about 10-40° C.
Process Period (time): about 10-30 second
Gas Flow Rates for Process Gas:
Gas 1: about 20 sccm to about 200 sccm
Gas 2: about 20 sccm to about 200 sccm
Gas 3: about 500 sccm to about 1500 sccm
Gas 4: about 100 sccm to about 500 sccm
Dilution Gas: about 0 sccm to about 1000 sccm

Example 2

Process Gas: $CF_4$, $C_2F_4$, $CHF_3$, $H_2$
Dilution Gas: He or Ar
Process Pressure: about 4-100 mTorr
Inductively Coupled Plasma Source Power: about 1000-2500 W
Workpiece Temperature: about 10-40° C.
Process Period (time): about 10-30 s
Gas Flow Rates for Process Gas:
Gas 1: about 0 sccm to about 200 sccm
Gas 2: about 0 sccm to about 200 sccm
Gas 3: about 0 sccm to about 200 sccm
Gas 4: about 0 sccm to about 300 sccm
Dilution Gas: about 0 sccm to about 1000 sccm Example process parameters for the etch process will now be set forth.

Example 3

Figure 8:
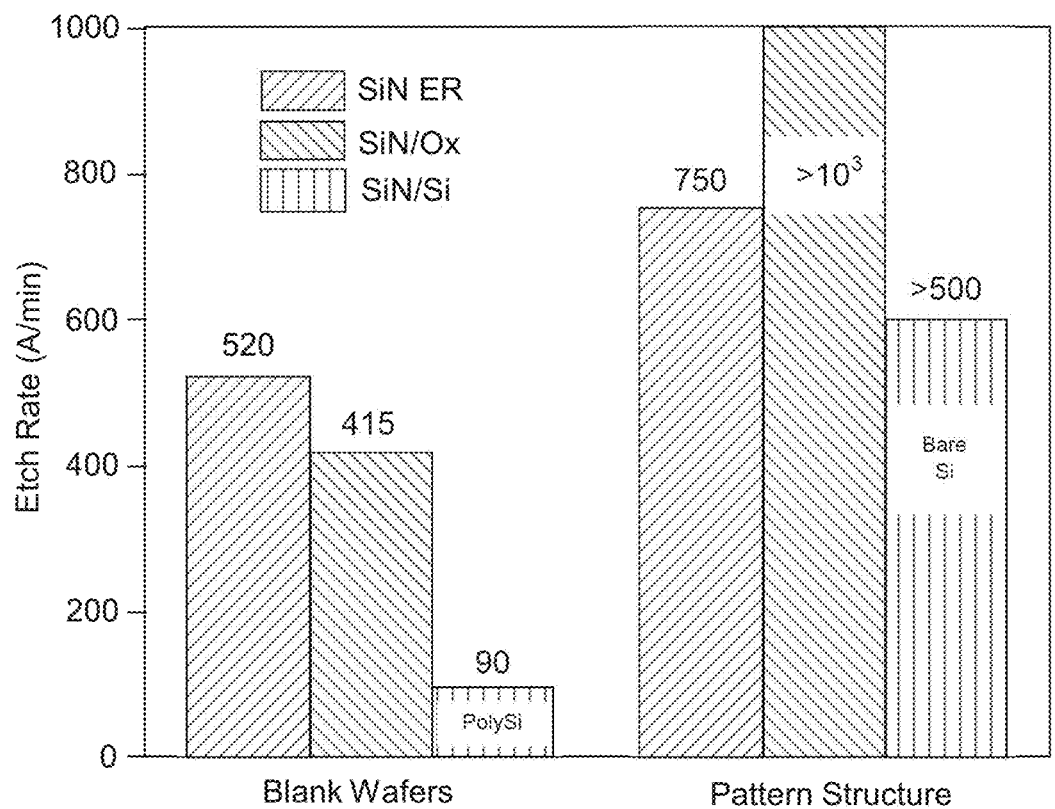
FIG. 8 illustrates etch rate selectivity for silicon nitride compared to a silicon dioxide layer and silicon layer according to example aspects of the present disclosure.

Process Gas: $CF_4$, $H_2$, $O_2$, $N_2$
Dilution Gas: He or Ar
Process Pressure: about 500-950 mTorr
Inductively Coupled Plasma Source Power: about 1000-2500 W
Workpiece Temperature: about 10-40° C.
Process Period (time): about 10-60 second
Gas Flow Rates for Process Gas:
Gas 1: about 50 sccm to about 400 sccm
Gas 2: about 20 sccm to about 200 sccm
Gas 3: about 500 sccm to about 2000 sccm
Gas 4: about 100 sccm to about 500 sccm
Dilution Gas: about 0 sccm to about 1000 sccm FIG. 8 illustrates the etch rate selectivity for silicon nitride compared to a silicon dioxide layer and silicon layer that have each been coated with the passivation layer according to example aspects of the present disclosure. Indeed, as shown in FIG. 8, the selectivity of silicon nitride compared to coated silicon dioxide layer in a patterned structure (e.g., 96-pair ONON stacked structure with aspect ratio of about 50:1) is greater than 1,000. The selectivity of silicon nitride relative to silicon in patterned structure (e.g., 96-pair ONON structure with aspect ratio of about 50) silicon layer is greater than 500.

Example process parameters for achieving the selectivity in FIG. 8 will now be set forth.

Etch Process:
Process Gas: $CF_4$, $H_2$, $O_2$, $N_2$
Dilution Gas: He or Ar
Process Pressure: about 900 mTorr
Inductively Coupled Plasma Source Power: about 2000 W
Workpiece Temperature: about 20° C.
Process Period (time): about 30 seconds
Gas Flow Rates for Process Gas:
Gas 1: about 250 sccm
Gas 2: about 60 sccm
Gas 3: about 1000 sccm
Gas 4: about 200 sccm
Dilution Gas: about 200 sccm Deposition Process:
Process Gas: $CF_4$, $CH_4$, $O_2$, $N_2$
Dilution Gas: He or Ar
Process Pressure: about 600 mTorr
Inductively Coupled Plasma Source Power: about 1500 W
Workpiece Temperature: about 20° C.
Process Period (time): about 10 second
Gas Flow Rates for Process Gas:
Gas 1: about 60 sccm
Gas 2: about 60 sccm
Gas 3: about 1000 sccm
Gas 4: about 200 sccm
Dilution Gas: about 200 sccm
Cycle Numbers: About 5

In other embodiments, example aspects of the present disclosure are directed to processes for treating a workpiece having a high aspect ratio structure that includes alternating layers of silicon dioxide and silicon nitride (e.g., ONON structure). The systems and methods described herein are useful for obtaining different vertical loading shapes within feature stacks of high aspect structures where selective etch of silicon nitride over silicon dioxide, or silicon is desired, such as for building 3D NAND devices. As used herein, a high aspect ratio structure is a structure having a depth at least 5 times greater than another dimension associated with the structure (e.g., width, length, diameter), such as at least 10 times greater than another dimension associated with the structure, such as at least 20 times greater than another dimension associated with the structure.

Selective etching of high aspect ratio structures often has vertical loading issues. For example, a single etching process performed on a high aspect ratio structure can result in non-uniform vertical loading because of the accumulation of etchant at the top of the high aspect ratio structure resulting in faster etching at the top or limited diffusion speed at the bottom of the high aspect ratio structure. While proper vertical loading and highly selective etch of silicon nitride over silicon dioxide and etching can be achieved using a wet etching process (using, for instance, hot phosphoric acid-containing various additives), wet etching suffers from multiple issues including a low etch rate (slow etching), residue, particle contamination of the workpiece, and is generally hard to control precisely. Switching from a wet process to a dry etch process may solve many of the issues mentioned above. For example, since a dry etch process is carried out at low pressures and generates a lesser amount of residue, the dry etch process reduces the particle contamination of the workpiece. Further, dry etching allows for much greater control of the etching process because the composition of the process gases can be controlled to increase, decrease, or stop the etch.

According to example aspects of the present disclosure, a plurality of dry etch processes can be performed to partially etch relatively different vertical portions of the high aspect ratio structure to create a desired vertical loading profile. For example, process parameters can be controlled to perform a first etch process that partially etches a first portion of the high aspect ratio structure. By tuning process parameters after the first etch process, a second etch process can be performed that etches a second portion of the high aspect ratio structure to engineer a desired and/or straight vertical loading shape.

According to example embodiments of the present disclosure, a workpiece having a high aspect ratio structure can be exposed to an initial breakthrough etch process to remove the oxide layer on the silicon nitride layers prior to exposing the workpiece to one or more etch processes. For example, the initial breakthrough etch process can expose a workpiece having a high aspect ratio structure including a plurality of alternating layers of silicon nitride and silicon dioxide to radicals generated from an etch process gas comprising fluoride and/or oxygen containing gases. Addition of oxygen containing gas can increases the F-species dissociation. While in some example embodiments, the initial breakthrough etch process has higher selectivity of silicon nitride as compared to the silicon or silicon dioxide, the difference in selectivity is slight so that the oxide fins of the high aspect ratio workpiece are not damaged and only the poor-quality oxide layer on silicon nitride surfaces is etched.

According to example embodiments of the present disclosure, the vertical loading shape of the high aspect ratio structure can be controlled by adjusting the composition of the various process gases. As an example, a process can expose a workpiece having a high aspect ratio structure including a plurality of alternating layers of silicon nitride and silicon dioxide to radicals generated from a first etch process gas in a first plasma to selectively etch silicon nitride over silicon dioxide in a particular portion of the workpiece. If a uniform and/or straight vertical loading profile is desired, the workpiece can be exposed to radicals generated from a second etch process gas in a second plasma in order to selectively etch silicon nitride over silicon dioxide in another portion of the workpiece to obtain the desired uniform etch.

According to example embodiments of the present disclosure, the vertical loading shape of the workpiece having a high aspect ratio structure can be controlled by adjusting the composition of the various process gases to control the formation of one or more salt-containing byproducts during the etching process. For example, a process can expose a workpiece having a high aspect ratio structure containing silicon nitride, silicon dioxide, and/or silicon to plasma generated using a combination of an F-containing gas and an H-containing gas. Due to the small size and high diffusion rate of hydrogen radicals, H-species density and residence time distribution along the high aspect ratio holes (e.g., spaces created by etching between and/or within layers) can be controlled. The presence of H-containing plasma, the silicon nitride etch rate increases drastically, resulting in a highly selective silicon nitride etch over silicon or silicon dioxide etch and provides for etching different vertical loading shapes on the high aspect ratio structure with different recess rates along the holes. Tuning the composition of the F-containing gas and/or the H-containing gas used in plasma generation in the presence of other compounds (e.g., nitrogen, oxygen, silicon, etc.), assists in the formation of F-containing salt (e.g., $(NH_4)_2SiF_6$). The F-containing salt can be used to control the vertical loading shape of the workpiece or to perform a slow and highly controlled silicon nitride etch. For example, according to example embodiments in the present disclosure, a process can expose a workpiece having a high aspect ratio structure to radicals generated from a first etch process gas comprising a first proportion of an F-containing and H-containing gas in a first plasma to selectively etch silicon nitride over silicon dioxide in a first portion of the workpiece. Then, by tuning the process gas to comprise a relatively different second proportion of the F-containing and H-containing gas such that the radicals generated from the second process gas in a second plasma selectively etch silicon nitride over silicon dioxide in a second portion of the workpiece. In some embodiments, the second portion can be different from the first portion.

According to example embodiments of the present disclosure, the vertical loading shape of the workpiece having a high aspect ratio structure can be controlled by adjusting conditions such as pressure, temperature, and/or process gas flow rate in the plasma and/or processing chamber. By tuning the temperature, pressure, and gas flow rate for each etch process, along with controlling the composition of the process gas, the precise vertical loading profile can be controlled. For example, by tuning the temperature, pressure, and gas flow rate for each etch process to which a workpiece having a high aspect ratio structure is exposed, the recess gradience is tunable. As another example, by tuning the temperature, pressure, and gas flow rate for each etch process to which a workpiece having a high aspect ratio structure is exposed, the recess onset position is tunable.

In some example embodiments, a workpiece can be exposed to a plurality of etch processes with a plurality of process gases, each process gas having the same or a different composition, to create a desired vertical loading shape of the high-aspect-ratio workpiece. In some example embodiments, the plurality of etch processes can be repeated cyclically to create a desired vertical loading shape of the high-aspect-ratio workpiece. In some embodiments, the plurality of etch processes can be performed for a fraction of the time of a single etch process, the plurality of etch processes being repeated cyclically for a total duration approximately equal to a single etch process. By reducing the time the workpiece is exposed to each etch process, there is a reduced probability of fluoride ion penetration into the workpiece having the high aspect ratio structure, resulting in a reduction of damage to the silicon dioxide or silicon in the target high aspect ratio structure in the workpiece.

In some example embodiments, exposing the workpiece to a plurality of etch processes results in an uneven etch front due to addition of hydrogen, oxygen, and/or fluorine containing process gas or due to possible micro-masking by salt formation (e.g., F-containing salts). To ensure a smooth, even etch front, the workpiece can be exposed to a smoothing etch process comprising a process gas including an oxygen-containing gas and/or a fluoride-containing gas. For example, an etch process can expose a workpiece having a high aspect ratio structure with an uneven etch front to radicals generated using an oxygen-containing and/or fluoride-containing gas after the workpiece is exposed to a plurality of etch processes to even out/smoothen out the uneven etch front to achieve a desired vertical lading shape. In some examples, the smoothing etch process can include a process gas that includes one or more diluent/dilution gases. In some examples, the smoothing etch process can include a process gas that does not include a diluent/dilution gas.

In some example embodiments, a cleaning process can be performed between each etch process or between each cycle of etch processes. For example, the first etch process and second etch process can be repeated cyclically to create a desired vertical loading shape of the high-aspect-ratio workpiece, and a cleaning process can be performed between each of the etch processes or after each set of etch processes. In some examples, the cleaning process can include exposing the process chamber and/or the workpiece to plasma with reactive or inert gas. Using plasma with reactive or inert gas can remove the residues from the processing chamber or treat the material in the workpiece.

According to example embodiments of the present disclosure, a workpiece having a high aspect ratio structure can be exposed to an annealing process during the etch process. Annealing can decompose any residual byproducts (e.g., F-containing salts) that were not pumped away during the cleaning process. In some embodiments, the annealing process can be performed ex-situ, in a different process unit or chamber. In some embodiments, the annealing process can be performed in-situ, using for example, a heating element (e.g., one or more lamps) or unit in the process chamber to increase the process temperature prior to the next cycle. According to example embodiments of the present disclosure, the processes described herein can be performed under a wide range of external conditions. For example, the processes described herein can be performed at temperatures of about 0° C. to about 100° C. As another example, the processes described herein can be performed at a pressure of about 5 mTorr to about 5 Torr. As yet another example, the processes described herein can be performed at a wide flow range of about 100 sccm to about 1000 sccm.

Aspects of the present disclosure can provide a number of technical effects and benefits. For instance, using different compositions of various process gases according to example embodiments can achieve a high silicon nitride etch rate. In addition, implementing dry etch processes according example aspects of the present disclosure can be at least two orders of magnitude faster than wet etching and can allow for more control of the overall etching process. In addition, byproduct formation during the etching process can be more tightly controlled, which in turn can allow for increased control of the vertical loading shape the high aspect ratio structure. Damage to the silicon dioxide and silicon in the workpiece can also be reduced.

Figure 9:
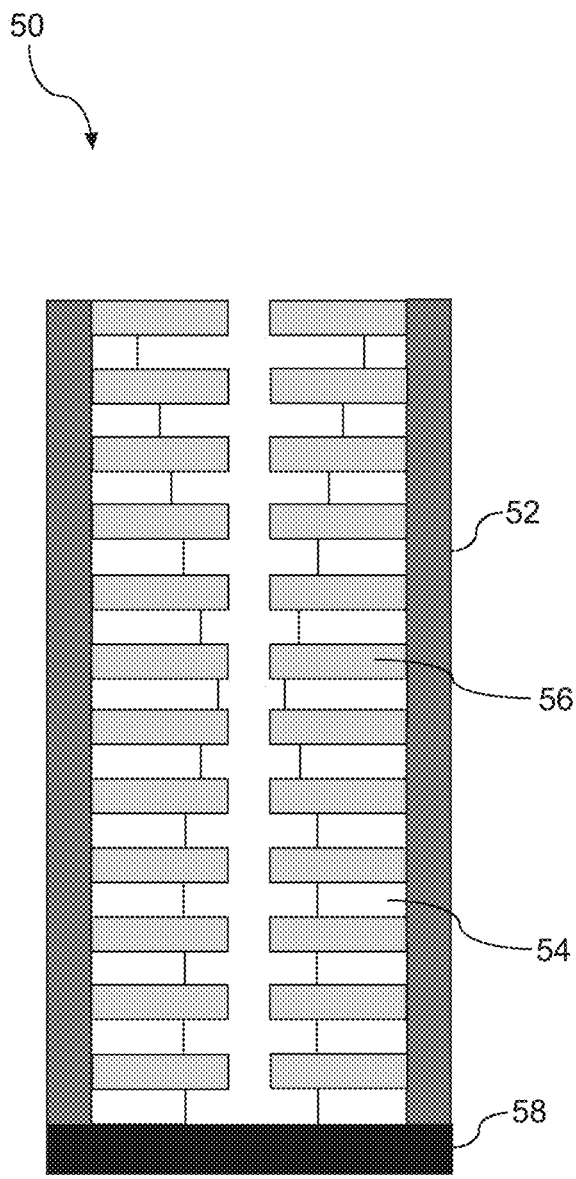
FIG. 9 depicts an example of an imperfect vertical loading shape for a high aspect ratio structure.

FIG. 9 depicts an example of an imperfect vertical loading shape for a workpiece 50 having a high aspect ratio structure 52. The high aspect ratio structure 52 includes a plurality of silicon nitride layers 54, and a plurality of silicon dioxide layers 56 disposed on a substrate 58, such as a silicon substrate. The high aspect ratio structure 52 can include a plurality of silicon nitride layers and a plurality of silicon dioxide layers arranged in an alternating fashion. For example, as shown in FIG. 9, the high aspect ratio structure 52 may contain a layer of silicon nitride having a layer of silicon dioxide on top of the silicon nitride layer in a vertical fashion. This vertical alternating arrangement between the silicon nitride layers 54 and silicon dioxide layers 56 may be repeated. The number of the alternating silicon nitride and silicon dioxide layers can range from 32 to more than 128. An etch process can be performed, leading to a partial silicon nitride recess resulting in a vase-like non-uniform vertical loading shape of the workpiece 50 having a high aspect ratio structure 52, as shown in FIG. 9. The vase-like vertical loading shape can be a result of decreasing silicon nitride recess down the high aspect ratio structure 52 with a slight increase in silicon nitride recess at the bottom of the high aspect ratio structure 52 because of desorption of byproduct and the adsorption of the etchant.

Figure 10:
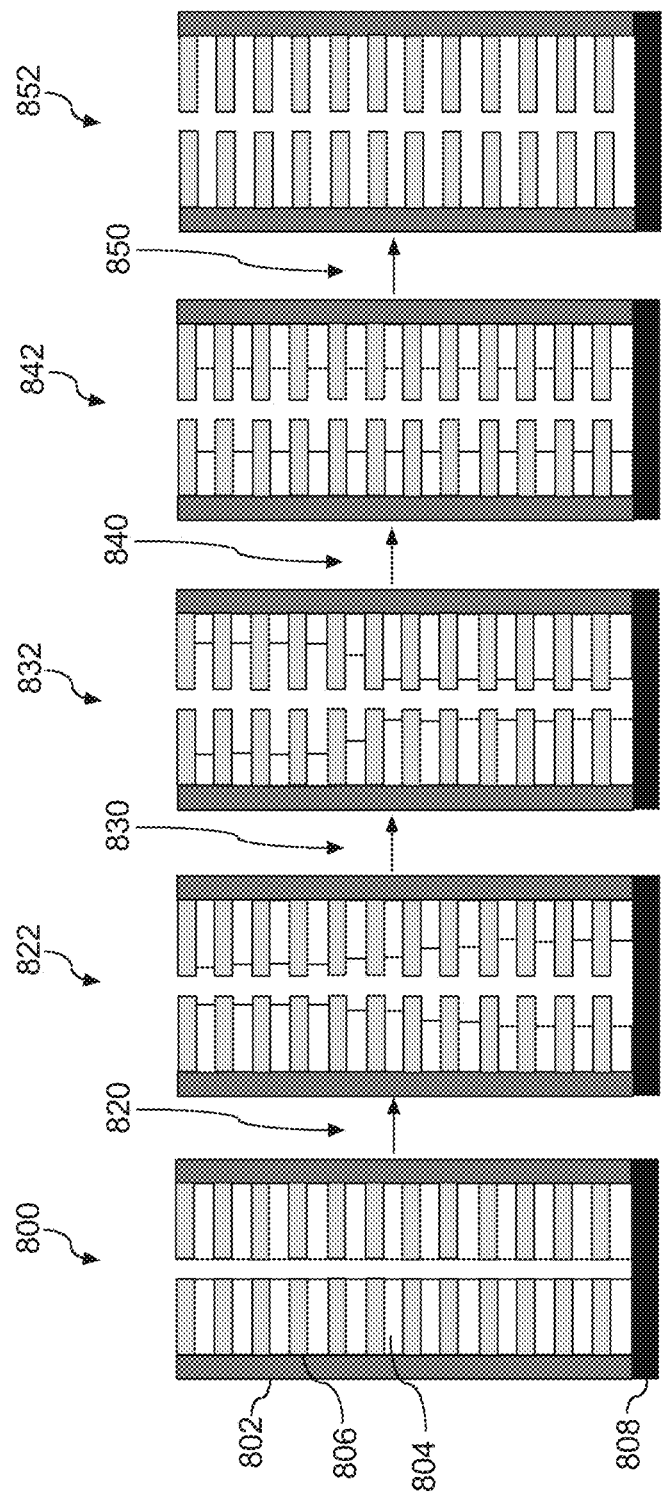
FIG. 10 depicts an example etch process according to example embodiments of the present disclosure.

FIG. 10 depicts an example etch processes (820, 830, 840) for a workpiece 200 having a high aspect ratio structure 802 according to example embodiments of the present disclosure. The high aspect ratio structure 802 includes a plurality of silicon nitride layers 804, and a plurality of silicon dioxide layers 806 disposed on a substrate 808, such as a silicon substrate. The high aspect ratio structure 802 can include a plurality of silicon nitride layers and a plurality of silicon dioxide layers arranged in an alternating fashion. For example, as shown in FIG. 2, the high aspect ratio structure 802 may contain a layer of silicon nitride having a layer of silicon dioxide on top of the silicon nitride layer in a vertical fashion. This vertical alternating arrangement between the silicon nitride layers 804 and silicon dioxide layers 806 may be repeated. The number of the alternating silicon nitride and silicon dioxide layers can range from 32 to more than 128.

A first etch process 820 can be conducted on the high aspect ratio structure 802 to etch a first portion of the plurality of silicon nitride layers 804 from the high aspect ratio structure 802. In certain aspects, the plurality of silicon nitride layers 804 are removed laterally. With reference to FIG. 10, laterally is shown as removal in the horizontal plane of the figure. A second etch process 830 can be conducted on the high aspect ratio structure 802 to etch a second portion of the plurality of silicon nitride layers 804 from the high aspect ratio structure 802. The first and the second etch processes can be repeated cyclically until the resultant workpiece contains a designated amount of silicon nitride etch 842 or substantially no silicon nitride 852 having only the silicon dioxide layers 806 remaining on the substrate 808 of the workpiece 852.

According to one aspect of the present disclosure, a first etch process can be performed on the high aspect ratio structure 802 using a first etch process gas that can selectively etch silicon nitride layers 804 from a first portion of the high aspect ratio structure 802. In some examples, etching silicon nitride from a first portion of the high aspect ratio structure 802 can include etching a plurality of silicon nitride layers in a lower portion of the high aspect ratio structure 802 at an etch rate greater than an etch rate of the plurality of silicon nitride layers in an upper portion of the high aspect ratio structure 802 (e.g., 822).

According to one aspect of the present disclosure, a second etch process can be performed on the high aspect ratio structure 802 that can selectively etch silicon nitride layers 804 from a second portion of the high aspect ratio structure 802. In some examples, etching silicon nitride from a second portion of the high aspect ratio structure 802 can include etching a plurality of silicon nitride layers in a upper portion of the high aspect ratio structure 802 at an etch rate greater than an etch rate of the plurality of silicon nitride layers in an lower portion of the high aspect ratio structure 802 (e.g., 832).

According to one aspect of the present disclosure, each etch process to remove silicon nitride layers 804 form at least a particular portion of the high aspect ratio structure 802 can include generating one or more species from the respective etch process gas using a plasma induced in a plasma chamber. In some examples, the generated species can be filtered to generate a respective filtered etching mixture and the high aspect ratio structure 802 can be exposed to the respective filtering mixture to remove least the particular portion of the plurality of silicon nitride layers 804.

According to one aspect of the present disclosure, each etch process can include a respective process gas that can be used to generate a respective species of plasma. The high aspect ratio structure 802 can be exposed to the generated species of plasma with a higher silicon nitride etch rate. For example, an etch process gas can include a composition of fluorine containing gas and hydrogen containing gas in a particular proportion and/or composition. The plasma generated with the etch process gas can include F-species and H-species. Including a selected range of H-species will predominantly etch silicon nitride over silicon dioxide or silicon because the presence of the H-species in the plasma increases the silicon nitride etch rate. As an example, tetrafluoromethane ($CF_4$) can be used as the fluorine containing gas and hydrogen ($H_2$) can be used as the hydrogen containing gas. Additionally, diluents such as argon (Ar), helium (He), and nitrogen ($N_2$), or other gases such as oxygen ($O_2$) or nitrogen ($N_2$) can be added for increased F-species dissociation (e.g., $CF_4$) dissociation.

According to one aspect of the present disclosure, each etch process can include a different proportion and/or concentration of the component process gases. As an example, each etch process gas can include a different concentration and/or proportion of the fluorine containing gas relative to process gasses used in other etch processes. As an example, each etch process gas can include a different concentration and/or proportion of the hydrogen containing gas relative to process gasses used in other etch processes. As an example, each etch process gas can include a different concentration and/or proportion of the oxygen containing gas relative to process gasses used in other etch processes. As an example, each etch process gas can include a different concentration and/or proportion of the nitrogen containing gas relative to process gasses used in other etch processes.

According to an aspect of the present disclosure, the process gas can include hydrogen gas and tetrafluoromethane in the ratio of 1:4 in the plasma gas to form a vertical loading shape like a vase with some silicon nitride recess at the top of the high aspect ratio structure 802, the silicon nitride recess decreasing towards the lower portion of the high aspect ratio structure 802. However, the silicon nitride etch rate can increase at the bottom because of desorption of byproduct and the adsorption of the etchant. An adjustment to the hydrogen and tetrafluoromethane ratio can create a more symmetrical hour-glass-shaped vertical loading. As another example, adjusting the composition of the process gas can result in strictly etching the silicon nitride layers 804 in the upper portion of the high aspect ratio structure 802.

According to aspects of the present disclosure, a plurality of etch processes can be performed on the high aspect ratio structure (e.g., 820, 830, 840, 850, etc.), with each etch process comprising a particular composition of a process gas resulting in a partial etching (e.g., 822, 832, 842) of a particular potion of the high aspect ratio structure 802. Additionally, each of the etch processes can be cyclically repeated to create a desired vertical loading shape (e.g., 822, 832, 842), or significantly etch out the silicon nitride layers 804 from the workpiece (e.g., 852).

Figure 11:
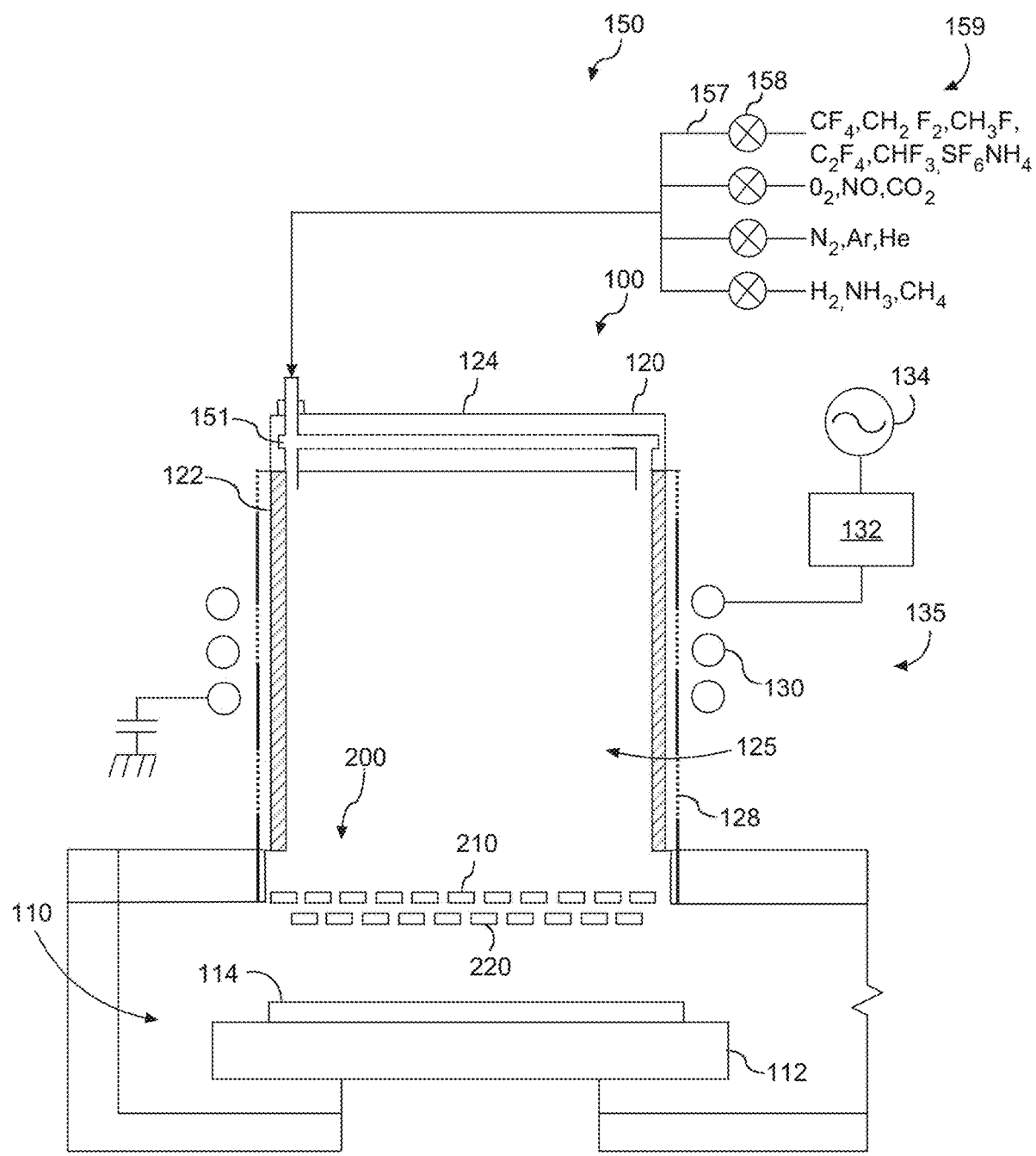
FIG. 11 depicts an example plasma processing apparatus according to example embodiments of the present disclosure.

FIG. 11 depicts an example plasma processing apparatus 100 that can be used to perform the deposition process(s) and etch process(s) according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure. The plasma source power can be about 1000 W to about 2000 W, such as about 1500 W, about 600 W, or about 2500 W. In some embodiments, the plasma power source can be from about 300 W to about 500 W.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., as described in detail below) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 11, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a small distance.

The first grid plate 210 can have a first grid pattern having a plurality of holes. The second grid plate 220 can have a second grid pattern having a plurality of holes. The first grid pattern can be the same as or different from the second grid pattern. Charged species can recombine on the walls in their path through the holes of each grid plate 210, 220 in the separation grid. Neutral species (e.g., radicals) can flow relatively freely through the holes in the first grid plate 210 and the second grid plate 220 with some degree of recombination. The size of the holes and thickness of each grid plate 210 and 220 can affect transparency for both charged and neutral species.

In some embodiments, the first grid plate 210 can be made of metal (e.g., aluminum) or other electrically conductive material, and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with a single grid plate. In some embodiments, the grid assembly can include at least three grid plates.

As shown in FIG. 11, the apparatus 100 can include a gas delivery system 150 configured to deliver process gas to the plasma chamber 120, for instance, via gas distribution channel 151 or another distribution system (e.g., showerhead). The gas delivery system 150 can include a plurality of feed gas lines 159. The feed gas lines 159 can be controlled using valves and/or mass flow controllers to deliver a desired amount of gases into the plasma chamber as process gas. As shown in FIG. 11, the gas delivery system 150 can include feed gas line(s) for delivery of fluorine-containing gas (e.g., $CF_4$, $C_2F_4$, $CHF_3$, $CH_2F_2$, $CH_3F$, $NF_3$, $SF_6$, $CF_xH_y$). The gas delivery system 150 can include feed gas line(s) for delivery of a hydrogen-containing gas (e.g., $H_2$, $CH_4$, $NH_3$, $NH_4$, $CF_xH_y$). The gas delivery system 150 can include feed gas line(s) for delivery of an oxygen-containing gas (e.g., $O_2$, NO, $CO_2$). The gas delivery system 150 can include feed gas line(s) for delivery of a dilution gas (e.g., $N_2$, Ar, He, Ne, or other inert gas). The gas delivery system 150 can include feed gas line(s) for delivery of a process gas composed of a fluorine-containing gas and hydrogen-containing gas. As an example, tetrafluoromethane ($CF_4$) can be used as the fluorine containing gas and hydrogen ($H_2$) can be used as the hydrogen containing gas. The tetrafluoromethane ($CF_4$) flow can be about 250 sccm to about 450 sccm, such as about 300 sccm and the hydrogen ($H_2$) flow can be about 20 sccm to about 200 sccm, such as about 80 sccm. Diluents such as argon (Ar), helium (He), and/or nitrogen ($N_2$) can be added to the process gases. Additionally, gases such as oxygen ($O_2$) or nitrogen ($N_2$) can be added for increased F-species dissociation. As an example, about 500 sccm to about 3000 sccm, such as about 1000 sccm of oxygen ($O_2$) can be added to the process gas mixture. As an example, about 50 sccm to about 500 sccm, such as about 200 sccm of nitrogen ($N_2$) can be added to the process gas mixture. A source of silicon can also be added, such as silicon tetrafluoride ($SiF_4$), to supply silicon for the formation of byproducts (e.g., $(NH_4)_2SiF_6$). The operating pressure for the process can be at about 200 mT to about 2000 mT, such as 900 mT or about 1000 mT, and the temperature can be at about 15° C. to about 50° C., such as about 20° C.

Figure 12:
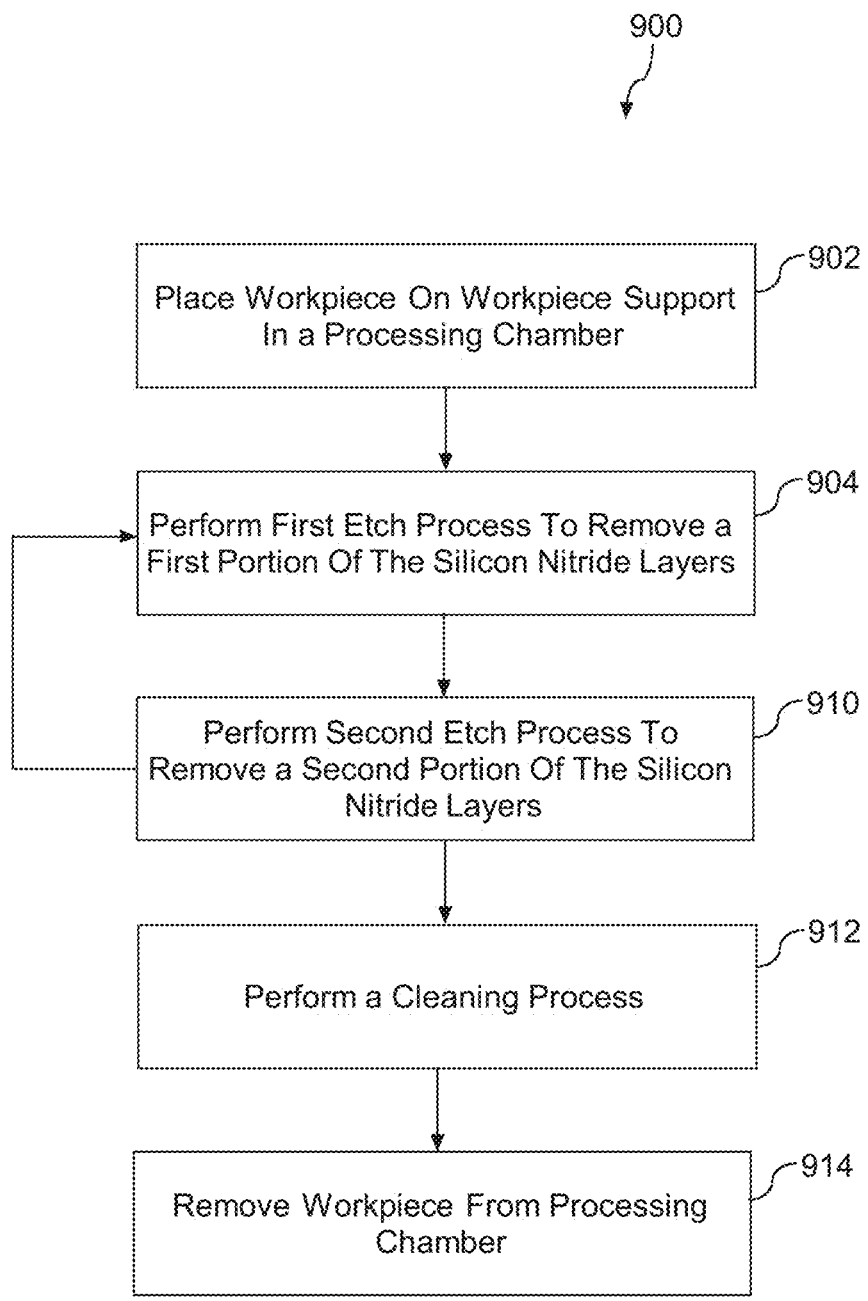
FIG. 12 depicts a flow diagram of an example method according to example embodiments of the present disclosure.

FIG. 12 depicts a flow diagram of one example method (900) according to example aspects of the present disclosure. The method (900) will be discussed with reference to the plasma processing apparatus 100 of FIG. 11 by way of example. The method (900) can be implemented in any suitable plasma processing apparatus. FIG. 12 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (902), the method can include placing a workpiece in a processing chamber of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 11. As an example, the workpiece 114 can comprise a high aspect ratio structure 802 according to example embodiments of the present disclosure. The high aspect ratio structure 802 includes a plurality of silicon nitride layers 804 and a plurality of silicon dioxide layers 806 disposed on a substrate 808, such as a silicon substrate.

At (904), the method can include conducting a first etch process to etch a first portion of the silicon nitride layers 804 on the workpiece 114. The first etch process can be carried out in a separate processing apparatus relative to the remainder of the method (900) or can be conducted using the same processing apparatus. The first etch process can include generating a plasma (such as a first plasma) from a first process gas in the plasma chamber 120, filtering ions with the separation grid assembly 200, and allowing neutral radicals to pass through the separation grid assembly 200.

The neutral radicals can be exposed to the workpiece 114 to selectively etch the first portion of silicon nitride layers 804 in the workpiece 114.

The process gas used during the first etch process (904) can include a fluorine-containing gas. For instance, the process gas can include tetrafluoromethane ($CF_4$), difluoromethane ($CH_2F_2$), fluoromethane ($CH_3F$), fluoroform ($CHF_3$), tetrafluoroethylene ($C_2F_4$), nitrogen trifluoride ($NF_3$), sulphur hexafluoride ($SF_6$), and combinations thereof. Other fluorine-containing gases can be used without deviating from the scope of the present disclosure.

Other suitable gases can be included in the process gas. For instance, the process gas can include a hydrogen-containing gas, e.g., hydrogen ($H_2$), methane ($CH_4$), or ammonia ($NH_3$). The process gas can include an oxygen-containing gas, e.g., oxygen ($O_2$), nitric oxide (NO), or carbon dioxide ($CO_2$) gas. The process gas can include a dilution gas, such as nitrogen ($N_2$) and/or an inert gas, such as helium (He), argon (Ar), or other inert gas. In some examples, the process gas can include a combination of one or more of the fluorine, hydrogen, and/or oxygen-containing gas.

At (910), the method can include performing a second etch process to etch a second portion of the silicon nitride layers 804 on the workpiece 114, such as a plasma etch process. The second etch process can be carried out in a separate processing apparatus relative to the remainder of the method (900) or can be conducted using the same processing apparatus. The second etch process can include generating a plasma (such as an etching plasma) from a second etch process gas in the plasma chamber 120, filtering ions with the separation grid assembly 200, and allowing neutral radicals to pass through the separation grid assembly 200. The neutral radicals can be exposed to the workpiece 114 to at least partially remove at least a portion of the silicon nitride layers from the workpiece 114.

The process gas used during the etch process (910) can include a fluorine-containing gas. For instance, the process gas can include tetrafluoromethane (CEO, difluoromethane ($CH_2F_2$), fluoromethane ($CH_3F$), fluoroform ($CHF_3$), tetrafluoroethylene ($C_2F_4$), and combinations thereof. Other fluorine-containing gases can be used without deviating from the scope of the present disclosure.

Other suitable gases can be included in the process gas. For instance, the process gas can include an oxygen-containing gas, e.g., oxygen ($O_2$), nitric oxide (NO), or carbon dioxide ($CO_2$) gas. The process gas can include a hydrogen-containing gas, e.g. hydrogen ($H_2$), methane ($CH_4$), or ammonia ($NH_3$). The process gas can include a dilution gas, such as nitrogen ($N_2$) and/or an inert gas, such as helium (He), argon (Ar), or other inert gas. In some examples, the process gas can include a combination of one or more of the fluorine, hydrogen, and/or oxygen-containing gas.

Further, as shown in FIG. 12, the method can further include alternating or cyclically repeating the first etch process (904) and the second etch process (910) until the desired amount of silicon nitride is etched or substantially all the silicon nitride layers have been removed from the workpiece 114.

At (912), the method can include performing a cleaning process to remove particulate contamination that may remain on workpiece 114 and/or to reduce byproduct formation by providing a period of desorption. The cleaning process can include exposing the processing chamber 110 and workpiece 114 contained therein to a purging gas.

The purging gas used during the cleaning process can include an $O_2$ gas. The purging gas can include an $H_2$ gas. The purging gas may be introduced to the processing chamber through the gas delivery system 150. The gas delivery system 150 can include feed gas line(s) for delivery of an oxygen-containing gas (e.g., oxygen ($O_2$), nitric oxide (NO), carbon dioxide ($CO_2$)). The gas delivery system 150 can include feed gas line(s) for delivery of a hydrogen-containing gas (e.g., hydrogen ($H_2$), methane ($CH_4$), ammonia ($NH_3$)). The purging gas may be introduced into the plasma chamber 120 and flow through the separation grid 200 into the processing chamber 110. The purging gas may be introduced directly into the processing chamber via a gas delivery system configured to deliver purging gas directly into the plasma chamber 120 (not shown) and/or at the separation grid, for instance, via gas distribution channels or other distribution systems. The purging gas may also be introduced to the processing chamber 110 via a gas injection port configured to inject the gas directly in the processing chamber 110.

At (914) of FIG. 12, the method can include removing the workpiece from the processing chamber. For instance, the workpiece 114 can be removed from workpiece support 112 in the processing chamber 110. The plasma processing apparatus can then be conditioned for future processing of additional workpieces.

Figure 13:
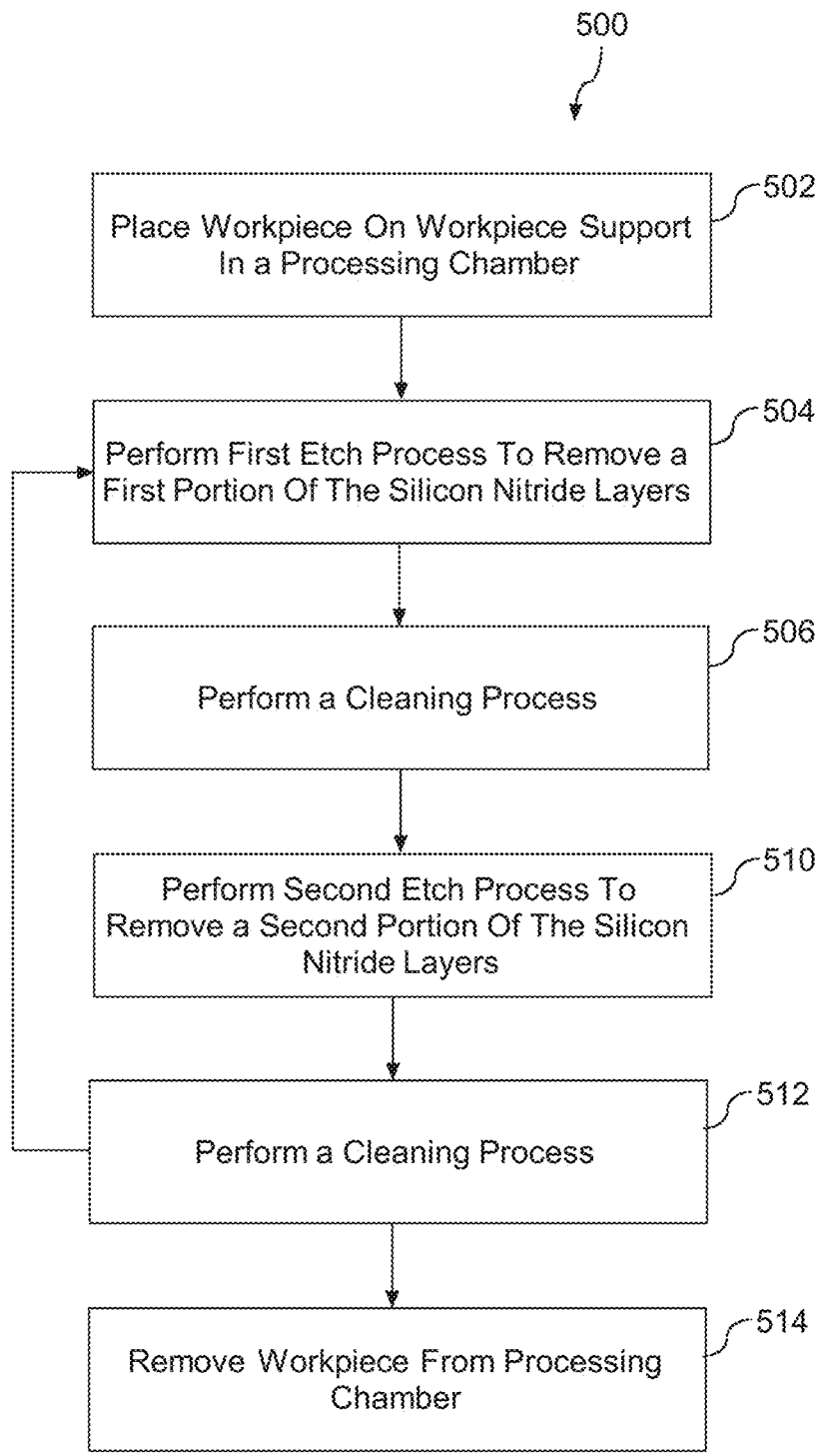
FIG. 13 depicts a flow diagram of an example method according to example embodiments of the present disclosure.

FIG. 13 depicts a flow diagram of one example method (500) according to example aspects of the present disclosure. The method (500) will be discussed with reference to the plasma processing apparatus 100 of FIG. 11 by way of example. The method (500) can be implemented in any suitable plasma processing apparatus. FIG. 13 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

FIG. 13 depicts a flow diagram of one example method (500) according to example aspects of the present disclosure. The method (500) includes similar processes as respectively provided in method (900) discussed in FIG. 12. However, at (506), the method may include performing a cleaning process to expose the processing chamber 110 and workpiece 114 contained therein to a purging gas.

The purging gas used during the cleaning process can include an $O_2$ gas. The purging gas can include an $H_2$ gas. The purging gas may be introduced to the processing chamber through the gas delivery system 150. The gas delivery system 150 can include feed gas line(s) for delivery of an oxygen-containing gas (e.g., oxygen ($O_2$), nitric oxide (NO), carbon dioxide ($CO_2$)). The gas delivery system 150 can include feed gas line(s) for delivery of a hydrogen-containing gas (e.g., hydrogen ($H_2$), methane ($CH_4$), ammonia ($NH_3$)). The purging gas may be introduced into the plasma chamber 120 and flow through the separation grid 300 into the processing chamber 110. The purging gas may be introduced directly into the processing chamber via a gas delivery system configured to deliver purging gas directly into the plasma chamber 120 (not shown) and/or at the separation grid, for instance, via gas distribution channels or other distribution systems. The purging gas may also be introduced to the processing chamber 110 via a gas injection port configured to inject the gas directly in the processing chamber 110.

Figure 14:
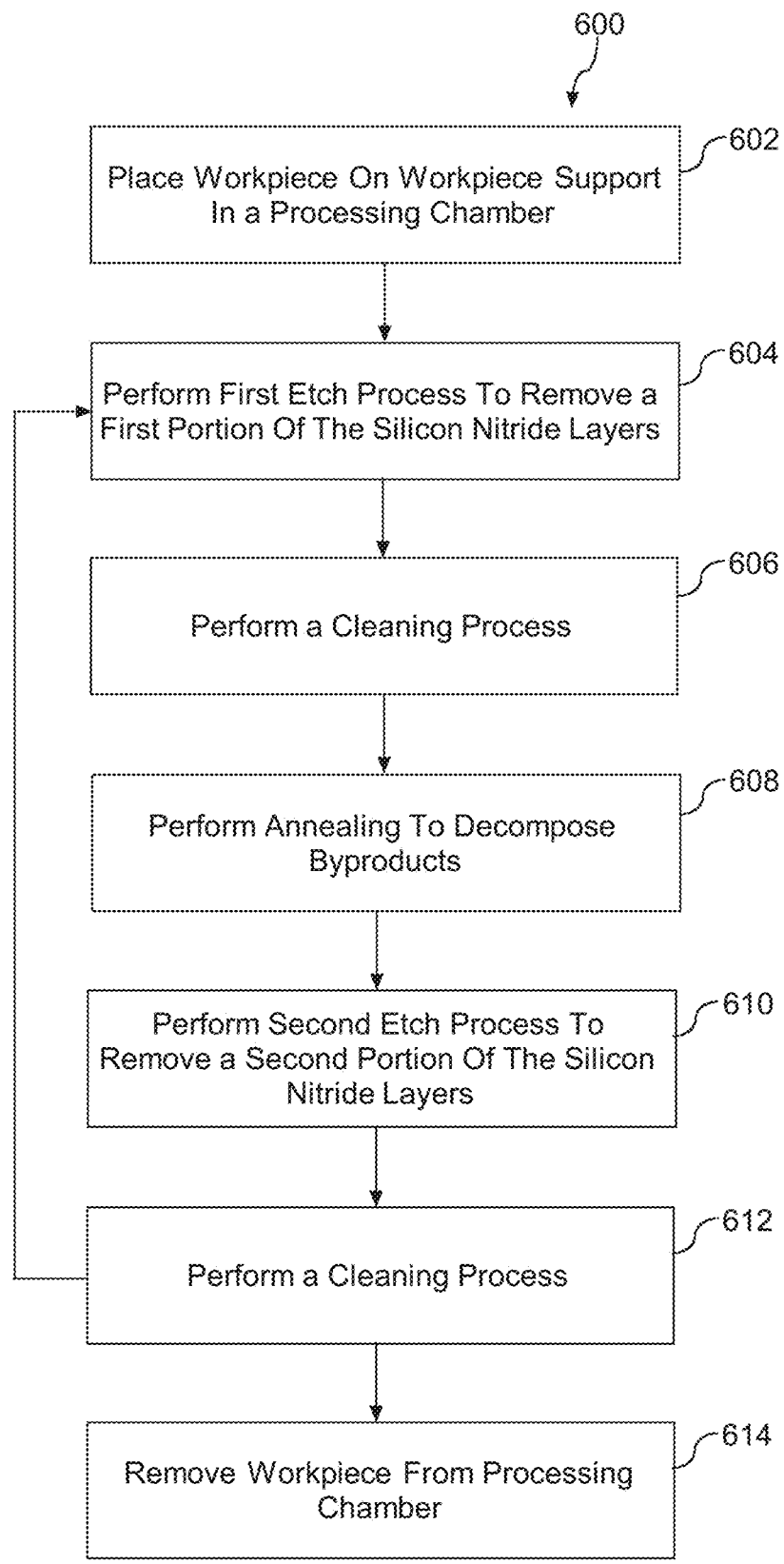
FIG. 14 depicts a flow diagram of an example method according to example embodiments of the present disclosure.

FIG. 14 depicts a flow diagram of one example method (600) according to example aspects of the present disclosure. The method (600) will be discussed with reference to the plasma processing apparatus 100 of FIG. 11 by way of example. The method (600) can be implemented in any suitable plasma processing apparatus. FIG. 14 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

The method (600) includes similar processes as respectively provided in method (500) discussed in FIG. 13. However, at (608), the method may include performing an annealing process to expose the processing chamber 110 and workpiece 114 contained therein to a high temperature (e.g., over a 1000 degrees Celsius) over a certain time period (e.g., several seconds) in a conditioned atmosphere. The annealing process may be performed to decompose any byproducts (such as F-salt byproducts) that were not pumped away during the cleaning process between cycles. The annealing process can be carried out in a separate processing apparatus relative to the remainder of the method (600) or can be carried out using the same processing apparatus. For example, the annealing process can be carried out using the same processing apparatus by incorporating a heating unit in the process chamber to increase the process temperature before the next cycle. In some examples, the annealing process may be performed after each of the first and second etch processes.

Figure 15:
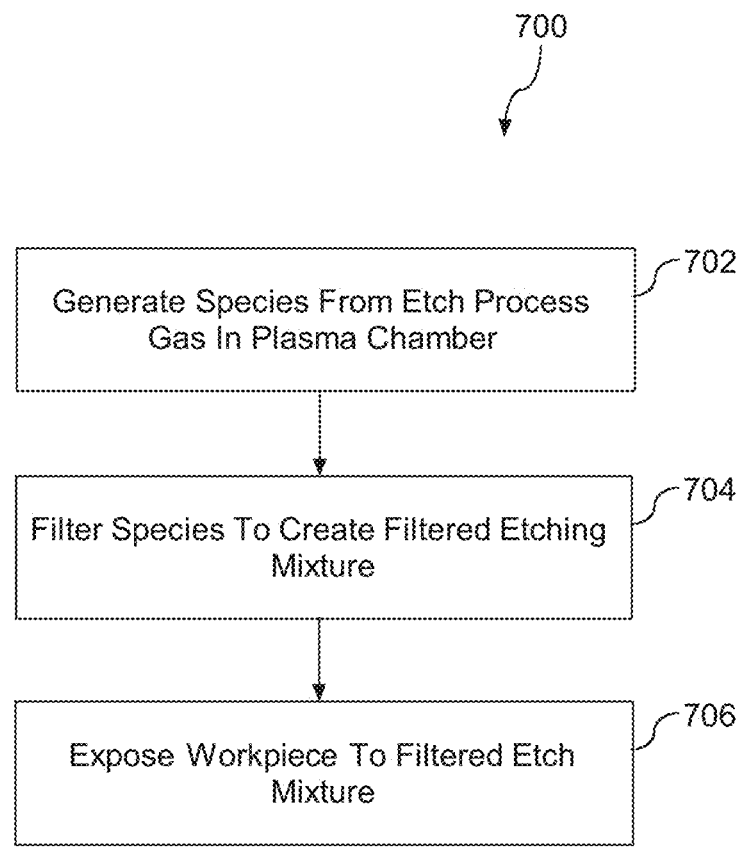
FIG. 15 depicts a flow diagram of an example method according to example embodiments of the present disclosure.

FIG. 15 depicts a flow diagram of one example method of the etch process (700) according to the present disclosure. The method (700) will be discussed with reference to the plasma processing apparatus 100 of FIG. 11 by way of example.

At (702) etch process can include generating a plasma from an etch process gas in the plasma chamber 120 of the plasma processing apparatus 100. The etch process gas may be introduced to the plasma chamber through the gas delivery system 150. The etch process gas may include any suitable process gas including, but not limited to: tetratluoromethane ($CF_4$), tetratluoroethylene ($C_2F_4$), fluoroform ($CHF_3$), difluoromethane ($CH_2F_2$), fluoromethane ($CH_3F$), oxygen ($O_2$), carbon dioxide ($CO_2$), nitric oxide (NO), nitrogen ($N_2$), methane ($CH_4$), nitrogen trifluoride ($NF_3$), sulphur hexafluoride ($SF_6$), and/or hydrogen ($H_2$) gas. The etch process gas can include a dilution gas, such as nitrogen ($N_2$) and/or an inert gas, such as helium (He), argon (Ar), or other inert gas.

At (704), the etch process can include filtering the species generated from (702) to generate a filtered etching mixture. The separation grid 200 can be used to perform ion filtering on the plasma generated in the plasma chamber 120 from the etch process gas to generate a filtered etching mixture. Briefly, charged species generated from the etch process gas in the plasma chamber 120 can recombine on the walls in their path through the holes of each grid plate 210, 200 in the separation grid 200. Neutral species (e.g., radicals) can flow relatively freely through the holes of each grid plate 210, 200. Accordingly, the separation grid 200 filters the plasma generated from the etch gas in the plasma chamber 120, allowing a filtered etching mixture to enter the processing chamber 110.

At (706), the etch process can include exposing the workpiece to the filtered etching mixture to remove at least a portion of the plurality of silicon nitride layers laterally at an etch rate that is greater than an etch rate of the silicon dioxide layers. The etch rate of the silicon dioxide layers may be zero. In some embodiments, the filtered etching mixture removes at least a portion of the plurality of silicon nitride layers laterally at an etch rate that is greater than an etch rate of the silicon substrate. The etch rate of the silicon substrate may be zero.

In some aspects, the etch process (700) may further include admitting a non-process gas through one or more gas injection ports at or below the separation grid 200 to adjust radical distribution or the energy of the radicals passing through the separation grid 200. (Not Shown). The non-process gas may include a dilution gas, such as nitrogen ($N_2$) and/or an inert gas, such as helium (He), argon (Ar), or other inert gas. The non-process gas may be injected prior to exposing the workpiece to the filtered etching mixture.

Figure 16:
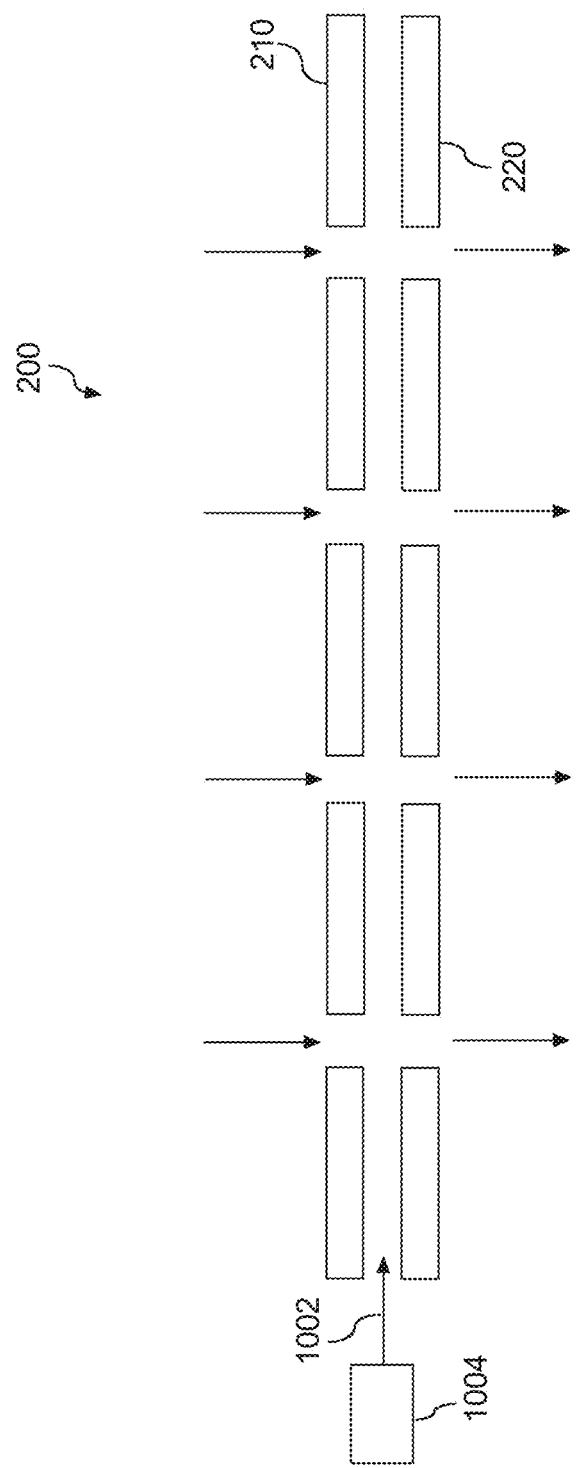
FIG. 16 depicts an example post plasma gas injection at a separation grid according to example embodiments of the present disclosure.

FIG. 16 illustrates an example post plasma gas injection at a separation grid according to example embodiments of the disclosure. FIG. 16 will be discussed with reference to the plasma processing apparatus 100 of FIG. 11 by way of example.

According to example aspects of the present disclosure, the plasma processing apparatus 100 can include one or more gas ports 1002 configured to inject a gas into the neutral species flowing through the separation grid 300. For instance, a gas port 1002 can be operable to inject a gas (e.g., a cooling gas) between grid plates in a multi-plate separation grid. In this way, the separation grid can provide post plasma gas injection into the neutral species. The post plasma gas injection can provide a number of technical effects and benefits. For example, the gas can be injected, for example, to control uniformity characteristics of a process. For example, a neutral gas (e.g., inert gas) can be injected to control uniformity in a radial direction with respect to the workpiece. Cooling gas can be injected to control the energy of radicals passing through the separation grid.

The separation grid 200 can be a multi-plate separation grid (e.g., a dual-plate grid (shown in FIG. 11, a three-plate grid, a four-plate grid, etc.). As shown in FIG. 16, the plasma processing apparatus 100 can include a gas port 1004 configured to inject a gas 1002 between grid plate 210 and grid plate 220, such as in the channel formed between grid plate 210 and grid plate 220. More particularly, the mixture of ions and neutral species generated in the plasma can be exposed to grid plate 210. The gas port 1004 can inject a gas 1002 or other substance into neutral species flowing through the grid plate 210. Neutral species passing through grid plate 220 can be exposed to a workpiece. In some embodiments, the gas port 1004 can inject a gas 1002 directly into the processing chamber 110 at a location below the separation grid and above the surface of the workpiece 114.

The gas 1002 or other substance from the gas port 1004 can be at a higher or lower temperature than the radicals coming from the plasma chamber 120 or can be the same temperature as the radicals from the plasma chamber 120. The gas can be used to adjust or correct uniformity, such as radical uniformity, within the plasma processing apparatus 100, by controlling the energy of the radicals passing through the separation grid 200. The non-process gas may include a dilution gas, such as nitrogen ($N_2$) and/or an inert gas, such as helium (He), argon (Ar) or other inert gas, in some embodiments, the gas 1002 can be an inert gas, such as helium, nitrogen, and/or argon.

In some aspects, the etch process, or the residual removal process, may further include the step of admitting a non-process gas through one or more gas ports 1004 at or below the separation grid 200 to adjust the energy of the radicals passing through the separation grid 200.

Figure 17:
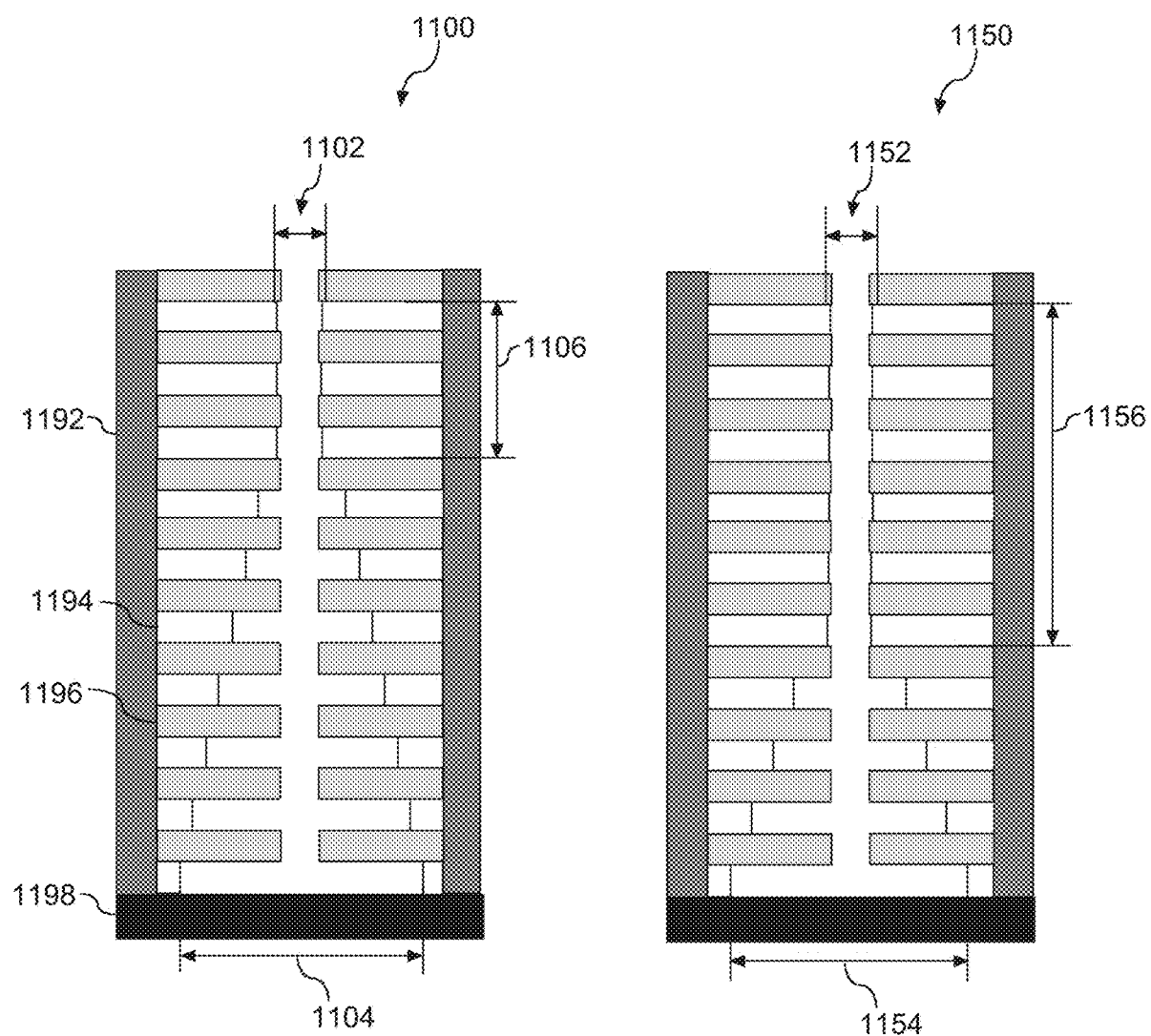
FIG. 17 depicts example vertical loading shapes according to example embodiments of the present disclosure.

FIG. 17 depicts example tunable parameters to control the vertical loading shape of a workpiece (1100 and 1150) having a high aspect ratio structure 1192 that includes a plurality of silicon nitride layers 1194, and a plurality of silicon dioxide layers 1196 disposed on a substrate 1198, such as a silicon substrate. The vertical loading shape of the workpiece having a high aspect ratio structure can be controlled by adjusting conditions such as pressure, temperature, and/or process gas flow rate for each of the plurality of etch processes to which the workpiece is exposed. By tuning the temperature, pressure, and gas flow rate for each etch process, along with controlling the composition of the process gas, the precise vertical loading profile can be controlled. In some embodiments, by tuning the temperature, pressure, and gas flow rate for each etch process to which a workpiece is exposed, the recess gradience (1102, 1152, 1104, 1154) of the workpiece can be controlled, resulting in a precise vertical loading profile. In some embodiments, the recess gradience (1102, 1152, 1104, 1154) can be small. For example, by tuning the temperature, pressure, gas flow rate, and/or composition for each etch process, the silicon nitride etch in the upper portion of the workpiece is slightly more than the silicon nitride etch lower portion of the workpiece (1100) or vice versa. In another example, the recess gradience (1102, 1152, 1104, 1154) can be large. For example, by tuning the temperature, pressure, gas flow rate, and/or composition for each etch process, the silicon nitride etch in the upper portion of the workpiece is significantly more than the silicon nitride etch lower portion of the workpiece (1150) or vice versa.

According to example embodiments, by tuning the temperature, pressure, and gas flow rate for each etch process to which a workpiece having a high aspect ratio structure is exposed, the recess onset position (1105 and 1156) of the workpiece can be control led, resulting in a precise vertical loading profile. In some embodiments, the recess onset position can be close to the upper portion of the workpiece (1100). In other embodiments, the recess onset position can be close to the lower portion of the workpiece (1150). In some embodiments, the recess onset position can be close to the central portion of the workpiece.

Further aspects of the invention are provided by the subject matter of the following clauses.

A method for processing a workpiece, the workpiece comprising a high aspect ratio structure, the high aspect ratio structure comprising a plurality of silicon nitride layers and a plurality of silicon dioxide layers arranged in an alternating fashion, the method comprising: placing the workpiece on a workpiece support in a processing chamber; performing a first etch process using a first etch process gas to remove at least a first portion of the plurality of silicon nitride layers laterally at an etch rate that is greater than an etch rate of the plurality of silicon dioxide layers; and performing a second etch process using a second process gas to remove at least a second portion of the plurality of silicon nitride layers laterally at an etch rate that is greater than an etch rate of the plurality of silicon dioxide layers.

The method according to any preceding clause, further comprising, performing a cleaning process after each of the first etch process and the second etch process.

The method according to any preceding clause, further comprising cyclically alternating the first etch process and the second etch process.

The method according to any preceding clause, wherein performing the cleaning process comprises exposing the processing chamber to a purging gas, wherein the purging gas comprises at least one of $H_2$, $O_2$, $CF_4$, Ar, or $N_2$.

The method according to any preceding clause, wherein performing the first etch process to remove at least the first portion of the plurality of silicon nitride layers laterally at an etch rate that is greater than an etch rate of the plurality of silicon dioxide layers comprises: generating one or more first species from a first etch process gas using a plasma induced in a plasma chamber; filtering the one or more first species to generate a first filtered etching mixture; and exposing the plurality of silicon nitride layers to the first filtered etching mixture in the processing chamber to remove at least the first portion of the plurality of silicon nitride layers laterally at an etch rate that is greater than an etch rate of the plurality of silicon dioxide layers.

The method according to any preceding clause, wherein removing at least the first portion of the plurality of silicon nitride layers comprises etching the plurality of silicon nitride layers in a lower portion of the workpiece at an etch rate greater than an etch rate of the plurality of silicon nitride layers in an upper portion of the workpiece.

The method according to any preceding clause, wherein the first portion of the plurality of silicon nitride layers comprises at least the plurality of silicon nitride layers in a lower portion of the workpiece.

The method according to any preceding clause, wherein filtering the one or more first species to generate the first filtered etching mixture comprises filtering the one or more first species via a separation grid separating the plasma chamber from the processing chamber.

The method according to any preceding clause, wherein performing the second etch process to remove at least the second portion of the plurality of silicon nitride layers laterally at an etch rate that is greater than an etch rate of the plurality of silicon dioxide layers comprises: generating one or more second species from a second etch process gas using a plasma induced in a plasma chamber; filtering the one or more second species to generate a second filtered etching mixture; and exposing the plurality of silicon nitride layers to the second filtered etching mixture in the processing chamber to remove at least the second portion of the plurality of silicon nitride layers laterally at an etch rate that is greater than an etch rate of the plurality of silicon dioxide layers.

The method according to any preceding clause, wherein removing at least the second portion of the plurality of silicon nitride layers comprises etching the plurality of silicon nitride layers in an upper portion of the workpiece at an etch rate greater than an etch rate of the plurality of silicon nitride layers in a lower portion of the workpiece.

The method according to any preceding clause, wherein the second portion comprises at least the plurality of silicon nitride layers in an upper portion of the workpiece.

The method according to any preceding clause, wherein filtering the one or more second species to generate the second filtered etching mixture comprises filtering the one or more second species via a separation grid separating the plasma chamber from the processing chamber.

The method according to any preceding clause, wherein the first etch process gas and the second etch process gas comprises a fluorine containing gas.

The method according to any preceding clause, wherein the first etch process gas comprises a different concentration of the fluorine containing gas relative to the second etch process gas.

The method according to any preceding clause, wherein the fluorine containing gas comprises tetrafluoromethane ($CF_4$), nitrogen trifluoride ($NF_3$), sulphur hexafluoride ($SF_6$), difluoromethane ($CH_2F_2$), fluoromethane ($CH_3F$), fluoroform ($CHF_3$), or tetrafluoroethylene ($C_2F_4$).

The method according to any preceding clause, wherein the first etch process gas and the second etch process gas comprises a hydrogen containing gas.

The method according to any preceding clause, wherein the first etch process gas comprises a different concentration of the hydrogen containing gas relative to the second etch process gas.

The method according to any preceding clause, wherein the hydrogen containing gas comprises hydrogen ($H_2$), methane ($CH_4$), or ammonia ($NH_3$).

The method according to any preceding clause, wherein the first etch process gas and the second etch process gas comprises an oxygen containing gas.

The method according to any preceding clause, wherein the first etch process gas comprises a different concentration of the oxygen containing gas relative to the second etch process gas.

The method according to any preceding clause, wherein the oxygen containing gas comprises oxygen ($O_2$), nitric oxide (NO), or carbon dioxide ($CO_2$).

The method according to any preceding clause, wherein the plasma is induced via an inductively coupled plasma source.

The method according to any preceding clause, further comprising admitting a non-process gas through one or more gas injection ports at or below a separation grid to adjust energy of radicals passing through the separation grid.

A method for processing a workpiece, the workpiece comprising a high aspect ratio structure, the high aspect ratio structure comprising a plurality of silicon nitride layers and a plurality of silicon dioxide layers arranged in an alternating fashion, the method comprising: placing the workpiece on a workpiece support in a processing chamber; performing a first etch process to remove at least a first portion of the plurality of silicon nitride layers laterally at an etch rate that is greater than an etch rate of the plurality of silicon dioxide layers, wherein removing at least the first portion of the plurality of silicon nitride layers comprises etching the plurality of silicon nitride layers in a lower portion of the workpiece at an etch rate greater than an etch rate of the plurality of silicon nitride layers in an upper portion of the workpiece; performing a second etch process to remove at least a second portion of the plurality of silicon nitride layers laterally at an etch rate that is greater than an etch rate of the plurality of silicon dioxide layers, wherein removing at least the second portion of the plurality of silicon nitride layers comprises etching the plurality of silicon nitride layers in an upper portion of the workpiece at an etch rate greater than an etch rate of the plurality of silicon nitride layers in a lower portion of the workpiece; and performing a cleaning process after each of the first etch process and the second etch process.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a high aspect ratio structure, the high aspect ratio structure comprising a plurality of silicon nitride layers and a plurality of silicon dioxide layers arranged in an alternating fashion, the method comprising:
    placing a workpiece on a workpiece support in a processing chamber;
    performing a deposition process to deposit a passivation layer on a surface of at least one of the plurality of silicon dioxide layers, wherein the deposition process comprises:
        flowing $CF_4$ at a flow rate of about 20 sccm to about 200 sccm, $CH_4$ at a flow rate of about 20 sccm to about 200 sccm, $O_2$ at a flows rate of about 500 sccm to about 1500 sccm, and $N_2$ at a flow rate of about 100 sccm to about 500 sccm into a plasma chamber to form a deposition process gas;
        generating one or more species from the deposition process gas using a plasma induced in a plasma chamber; and
        exposing the workpiece to the one or more species generated from the deposition process gas to deposit the passivation layer, wherein the passivation layer comprises a fluorocarbon polymer, a hydrofluorocarbon polymer, a slat ammonium silicon fluoride salt, or a combination thereof; and
    performing an etch process to remove at least a portion of the plurality of silicon nitride layers laterally at an etch rate that is greater than an etch rate of the plurality of silicon dioxide layers.

2. The method of claim 1, further comprising cyclically alternating the deposition process and the etch process.

3. The method of claim 1, wherein a ratio of etch rate of the plurality of silicon nitride layers to the etch rate of the plurality of silicon dioxide layers is greater than about 500.

4. The method of claim 1, wherein performing the deposition process to deposit the passivation layer on the plurality of silicon dioxide layers comprises:
    filtering the one or more species to generate a filtered deposition mixture; and
    exposing the plurality of silicon dioxide layers to the filtered deposition mixture.

5. The method of claim 4, wherein filtering the one or more species to generate a filtered deposition mixture comprises filtering the one or more species via a separation grid separating the plasma chamber from the processing chamber.

6. The method of claim 5, further comprising the step of admitting a non-process gas through one or more gas injection ports at or below the separation grid to adjust energy of radicals passing through the separation grid.

7. The method of claim 1, wherein performing the etch process to remove at least a portion of the plurality of silicon nitride layers laterally at an etch rate that is greater than an etch rate of the plurality of silicon dioxide layers comprises:
    generating one or more species from an etch process gas using a plasma induced in a plasma chamber, wherein the plasma is induced by via an inductively coupled plasma source;
    filtering the one or more species to generate a filtered etching mixture; and exposing the plurality of silicon nitride layers to the filtered etching mixture to remove at least a portion of the plurality of silicon nitride layers laterally at an etch rate that is greater than an etch rate of the plurality of silicon dioxide layers.

8. The method of claim 7, wherein filtering the one or more species to generate a filtered etching mixture comprises filtering the one or more species via the separation grid separating the plasma chamber from the processing chamber.

9. The method of claim 8, further comprising the step of admitting a non-process gas through one or more gas injection ports at or below the separation grid to adjust energy of radicals passing through the separation grid.

10. The method of claim 7, wherein the etch process gas comprises a fluorine containing gas comprising tetrafluoromethane ($CF_4$), difluoromethane ($CH_2F_2$), fluoromethane ($CH_3F$), fluoroform ($CHF_3$), or tetrafluoroethylene ($C_2F_4$).

11. The method of claim 7, wherein the etch process gas comprises hydrogen containing gas comprising hydrogen (Hz), methane ($CH_4$), or ammonia ($NH_3$).

12. The method of claim 7, wherein the etch process gas comprises an oxygen containing gas comprising oxygen ($O_2$), nitric oxide (NO), or carbon dioxide ($CO_2$).

13. The method of claim 1, further comprising performing a cleaning process after the deposition process and before the etch process.

14. The method of claim 13, wherein the cleaning process comprises exposing the processing chamber to a purging gas, wherein the purging gas comprises $H_2$ or $O_2$.

15. The method of claim 1, further comprising a residual removal process to remove residual passivation layer on the structure, the residual removal process comprising:
    generating one or more species from a second etch process gas using a plasma induced in a plasma chamber;
    filtering the one or more species to generate a filtered second etching mixture; and
    exposing the plurality of silicon nitride layers and silicon dioxide layers to the filtered second etching mixture in the processing chamber, wherein the second etching mixture removes any remaining passivation layer from the workpiece.

16. A method for processing a workpiece, the workpiece comprising a high aspect ratio structure, the high aspect ratio structure comprising a plurality of silicon nitride layers and a plurality of silicon dioxide layers arranged in an alternating fashion, the method comprising:
    placing the workpiece in a processing chamber, the processing chamber located downstream from a plasma chamber for generating a plasma, wherein the processing chamber is separated from the plasma chamber by a separation grid;
    flowing $CF_4$ at a flow rate of about 20 sccm to about 200 sccm, $CH_4$ at a flow rate of about 20 sccm to about 200 sccm, $O_2$ at a flows rate of about 500 sccm to about 1500 sccm, and $N_2$ at a flow rate of about 100 sccm to about 500 sccm into a plasma chamber to form a deposition process gas;
    generating a deposition plasma in the plasma chamber from the deposition process gas;
    filtering the deposition plasma via the separation grid to generate a filtered deposition mixture;
    exposing the workpiece to the filtered deposition mixture, wherein the filtered deposition mixture deposits a passivation layer on a surface of each of the silicon dioxide layers, wherein the passivation layer comprises a fluorocarbon polymer, a hydrofluorocarbon polymer, a slat ammonium silicon fluoride salt, or a combination thereof;
    generating an etching plasma in the plasma chamber;
    filtering the etching plasma via the separation grid to generate a filtered etching mixture; and
    exposing the workpiece to the filtered etching mixture, wherein the filtered etching mixture removes at least a portion of the plurality of silicon nitride layers laterally at an etch rate that is greater than an etch rate of the plurality of silicon dioxide layers.

17. The method of claim 16, further comprising cyclically alternating exposing the workpiece to the filtered deposition mixture and exposing the workpiece to the filtered etching mixture.

* * * * *